(12) United States Patent
Miyachi et al.

(10) Patent No.: US 7,098,063 B2
(45) Date of Patent: Aug. 29, 2006

(54) SEMICONDUCTOR LASER DEVICE AND METHOD OF MANUFACTURING THE SAME

(75) Inventors: Mamoru Miyachi, Saitama-ken (JP); Atsushi Watanabe, Saitama-ken (JP); Hirokazu Takahashi, Saitama-ken (JP); Yoshinori Kimura, Sitama-ken (JP)

(73) Assignee: Pioneer Corporation, Tokyo (JP)

( * ) Notice: Subject to any disclaimer, the term of this patent is extended or adjusted under 35 U.S.C. 154(b) by 258 days.

(21) Appl. No.: 10/743,542

(22) Filed: Dec. 23, 2003

(65) Prior Publication Data

US 2004/0184502 A1    Sep. 23, 2004

(30) Foreign Application Priority Data

Dec. 25, 2002    (JP) .............................. 2002-374635

(51) Int. Cl.
*H01L 21/00*    (2006.01)
(52) U.S. Cl. .................... 438/33; 438/107; 438/464
(58) Field of Classification Search ............ 438/22–47, 438/106–127, 459–464; 257/E21.511
See application file for complete search history.

(56) References Cited

U.S. PATENT DOCUMENTS

| | | | | |
|---|---|---|---|---|
| 5,638,391 | A * | 6/1997 | Shima et al. | 372/44.011 |
| 5,802,088 | A | 9/1998 | Otsuka et al. | 372/36 |
| 5,920,766 | A * | 7/1999 | Floyd | 438/35 |
| 6,136,623 | A * | 10/2000 | Hofstetter et al. | 438/28 |
| 6,282,220 | B1 * | 8/2001 | Floyd | 372/50.1 |
| 6,420,242 | B1 * | 7/2002 | Cheung et al. | 438/458 |
| 6,790,695 | B1 * | 9/2004 | Ogihara et al. | 438/33 |
| 6,830,946 | B1 * | 12/2004 | Yanagisawa et al. | 438/26 |
| 6,901,086 | B1 * | 5/2005 | Li | 372/7 |
| 6,956,322 | B1 * | 10/2005 | Ikeda | 313/498 |
| 2001/0048703 | A1 | 12/2001 | Oh | 372/43 |
| 2003/0002549 | A1 * | 1/2003 | Oh | 372/36 |
| 2004/0136423 | A1 * | 7/2004 | Coldren et al. | 372/38.02 |

FOREIGN PATENT DOCUMENTS

| | | |
|---|---|---|
| EP | 1 126 526 A2 | 8/2001 |
| JP | 2000 252593 | 9/2000 |
| JP | 2001-230502 | 8/2001 |
| JP | 2002-118331 | 4/2002 |
| JP | 2002-176229 | 6/2002 |

OTHER PUBLICATIONS

*Abstract Only*, JP 10 321957 A, Nakatsuka Shinichi, Dec. 4, 1998.

* cited by examiner

*Primary Examiner*—Savitri Mulpuri
(74) *Attorney, Agent, or Firm*—Arent Fox PLLC

(57) ABSTRACT

A semiconductor laser device comprises: a first light-emitting element having a first laser part, an insulating layer, and an ohmic electrode layer; and a second light-emitting element having a second laser part, an insulating layer, and an ohmic electrode layer. The first laser part has a ridge waveguide, and is formed by stacking thin films of group-III nitride compound semiconductors (for example, GaN-based semiconductors). The second laser part has a ridge waveguide, and is formed by stacking thin films of group III–V compound semiconductors (such as GaAs). The first laser part and the second laser part are integrally bonded to each other by the interposition of an adhesive metal layer which is formed between the ohmic electrode layers. This provides the semiconductor laser device with a small distance between the light-emitting spots of the laser parts.

3 Claims, 18 Drawing Sheets

SEMICONDUCTOR LASER DEVICE AND METHOD OF MANUFACTURING THE SAME

BACKGROUND OF THE INVENTION

1. Field of the Invention

The present invention relates to a semiconductor laser device for emitting a plurality of laser beams having different wavelengths and a method of manufacturing the same.

The present application claims priority from Japanese Patent Application No. 2002-374635, the disclosure of which is incorporated herein by reference in its entirety.

2. Description of the Related Art

In recent years, a semiconductor laser device called multi-wavelength laser for emitting a plurality of laser beams having different wavelengths has been under research and development.

For example, in the field of data recording and reproducing apparatuses with storage media called optical discs, typified by CDs (Compact Discs), DVDs (Digital Versatile Discs), etc., it has been of importance to develop a semiconductor laser device which can emit a plurality of laser beams having different wavelengths. The aim is to develop an optical pickup which has compatibility with various CDs, DVDs, and the like commercialized heretofore and can cope with new storage media capable of recording at higher densities.

For such a semiconductor laser device, ones having a hybrid structure have been proposed (for example, Japanese Patent Laid-Open Publication No. 2001-230502: hereinafter, referred to as patent document 1) in order to solve difficulties in implementing it as a monolithic semiconductor device.

As disclosed in FIG. 1 of the foregoing patent document 1, the semiconductor laser device comprises a first light-emitting element and a second light-emitting element which are manufactured on chips separately. The first light-emitting element has a GaN-based laser part which is formed on a first substrate and emits a laser beam of short wavelength (for example, in a 400-nm waveband). The second light-emitting element has an AlGaInP-based laser part and an AlGaAs-based laser part which are formed in parallel on a second substrate and emit laser beams of longer wavelengths (for example, in 600- to 700-nm wavebands). These first and second light-emitting elements on chips are stacked and mounted on a support substrate (so-called submount) to achieve the semiconductor laser device of hybrid structure.

Here, the first light-emitting element is mounted on the support substrate with its GaN-based laser part between the first substrate and the support substrate. The second light-emitting element is mounted-on the first light-emitting element via the first substrate with its AlGaInP-based and AlGaAs-based laser parts interposed between the first substrate and the second substrate.

Consequently, in this structure, the GaN-based laser part for emitting a laser beam of short wavelength (for example, in a 400-nm waveband) is attached to the support substrate, the AlGaInP-based and AlGaAs-based laser parts for emitting laser beams of longer wavelengths (for example, in 600- to 700-nm wavebands) are attached to the GaN-based laser part via the first substrate, and the second substrate is located on these AlGaInP-based and AlGaAs-based laser parts.

This semiconductor laser devices is then mounted on an optical pickup. The GaN-based laser part emits the laser beam of short wavelength to perform information recording or information reproduction on a storage medium capable of high-density recording. The AlGaInP-based and AlGaAs-based laser parts emit the laser beams of longer wavelengths to perform information recording or information reproduction on various CDs, DVDs, and the like commercialized heretofore. Thus, a compatible optical system is realized.

By the way, the conventional semiconductor laser devices, as described above, have the structure that the first light-emitting element and the second light-emitting element are manufactured as separate semiconductor chips in advance and the first and second light-emitting elements on chips are stacked and mounted on the support substrate (submount). The light-emitting elements on chips must therefore be aligned and assembled with extremely high precision so that the light-emitting elements emit the respective laser beams from their cleavages in the same direction. This means a problem of extremely complicated manufacturing steps, for example, in manufacturing semiconductor laser devices intended for an optical pickup.

In the conventional semiconductor laser devices, the GaN-based laser part of the first light-emitting element is mounted close to the support substrate while the AlGaInP-based and AlGaAs-based laser parts of the second light-emitting element are mounted on the first substrate which the first light-emitting element is provided with.

According to this structure, however, the first substrate which has a large thickness lies between the first and second light-emitting elements. As also discussed in the foregoing patent document 1, the first substrate (GaN substrate) typically has a thickness of the order of 100 μm. This produces the problem that the position of emission of the laser beam from the GaN-based laser part (the position of the light-emitting spot) and the positions of emission of the laser beams from the AlGaInP-based and AlGaAs-based laser parts (the positions of the light-emitting spots) are wide apart. In short, there occurs the problem that the distance between the light-emitting spots of the laser beams increases.

For example, take the case where an optical pickup incorporates this semiconductor laser device for information recording or information reproduction. If the position of emission of the GaN-based laser part (the position of the light-emitting spot) is centered to the optical axis of the optical system constituting the optical pickup, then the direction of the laser beams emitted from the AlGaInP-based and AlGaAs-based laser parts may deviate greatly from the optical axis of the optical system owing to the thickness of the first substrate. This can sometimes cause aberrations and the like.

In another case, a prism or any other optical element may be added to eliminate the adverse effect of the thickness of the first substrate, for example, in order that the laser beam emitted from the GaN-based laser part and the laser beams emitted from the AlGaInP-based and AlGaAs-based laser parts are all centered to the optical axis of the optical system in the optical pickup. This, however, produces such problems as an increased parts count.

SUMMARY OF THE INVENTION

The present invention has been achieved in view of the conventional problems mentioned above. It is thus an object of the present invention to provide a semiconductor laser device which emits a plurality of laser beams having different wavelengths with a smaller distance between the light-emitting spots of the laser beams, and a method of manufacturing the same.

Another object of the present invention is to provide a manufacturing method which allows easy, high-volume fabrication of a semiconductor laser device in which the distance between the light-emitting spots of the laser beams is controlled with high precision.

The semiconductor laser device according to a first aspect of the present invention (as set forth in claim 1) is a semiconductor laser device for emitting a plurality of laser beams having different wavelengths, comprising: a first laser part occupying a predetermined area; and a second laser part formed on a semiconductor substrate, the second laser part occupying an area greater than that of the first laser part. Aside of the second laser part opposite from the semiconductor substrate and a side of the first laser part closer to its light-emitting part are bonded by a conductive adhesive layer. The first laser part bonded to the adhesive layer has a multilayer structure in which thin films of group-III nitride compound semiconductors containing at least one of aluminum (Al), gallium (Ga), and indium (In), and nitrogen (N) are stacked.

The method of manufacturing a semiconductor laser device according to a second aspect of the present invention (as set forth in claim 9) is a method of manufacturing a semiconductor laser device having a first laser part and a second laser part for emitting laser beams of different wavelengths, the method comprising: a first step of stacking thin films of group-III nitride compound semiconductors containing at least one selected from the group consisting of aluminum (Al), gallium (Ga), and indium (In), and nitrogen (N) on a sapphire substrate to fabricate the first laser part, and forming a first adhesive layer on the first laser part to fabricate a first intermediate; a second step of stacking thin films of group III–V compound semiconductors containing at least one selected from the group consisting of aluminum (Al), gallium (Ga), and indium (In), and at least one of arsenic (As), phosphorus (P), and antimony (Sb) on a GaAs substrate to form second laser parts protruding from the surface of the GaAs substrate, the second laser parts each having a multilayer structure of the thin films, and forming a second adhesive layer all over the protruding second laser parts and the GaAs substrate where the second laser parts is not formed, thereby forming a second intermediate for forming second light-emitting elements; a third step of bonding the first adhesive layer and the second adhesive layer lying on the second laser parts so that waveguides of the first laser part lie close to waveguides of the second laser parts, thereby fabricating a third intermediate having the first laser part and the second laser parts bonded to each other through the interposition of an adhesive layer; a fourth step of irradiating a junction between the sapphire substrate and the first laser part with light to be transmitted through the sapphire substrate and absorbed by the group-III nitride compound semiconductors, so that the first laser part in the vicinity of the junction is decomposed, and portions of the first laser part corresponding to regions where the first and second adhesive layers are not in contact are broken; a fifth step of removing the sapphire substrate from the third intermediate to expose the first laser part and the second adhesive layer lying on the GaAs substrate; and a sixth step of cleaving the third intermediate after the removal of the sapphire substrate, and dividing the resultant where the second adhesive layer is exposed, thereby fabricating semiconductor laser devices each including a first light-emitting element having the first laser part and a second light-emitting element having the second laser part.

The method of manufacturing a semiconductor laser device according to a third aspect of the present invention (as set forth in claim 10) is a method of manufacturing a semiconductor laser device having a first laser part and a second laser part for emitting laser beams of different wavelengths, the method comprising: a first step of stacking thin films of group-III nitride compound semiconductors containing at least one selected from the group consisting of aluminum (Al), gallium (Ga), and indium (In), and nitrogen (N) on a sapphire substrate to form the first laser part, and forming an adhesive layer on regions of the first laser part along waveguides thereof to fabricate a first intermediate, the regions including the waveguides; a second step of stacking thin films of group III–V compound semiconductors containing at least one selected from the group consisting of aluminum (Al), gallium (Ga), and indium (In), and at least one selected from the group consisting of arsenic (As), phosphorus (P), and antimony (Sb) on a GaAs substrate to form a second laser part, and forming a second adhesive layer over the entire surface of the second laser part to fabricate a second intermediate; a third step of bonding the first adhesive layer and the second adhesive layer so that the waveguides of the first laser part lie close to waveguides of the second laser part, thereby bonding the first laser part and the second laser part through the interposition of an adhesive layer solidified and fabricating a third intermediate in which part of the second adhesive layer is not bonded to the first laser part; a fourth step of irradiating a junction between the sapphire substrate and the first laser part with light to be transmitted through the sapphire substrate and absorbed by the group-III nitride compound semiconductors, so that the first laser part is decomposed in the vicinity of the junction, and regions of the first laser part where the first adhesive layer is not formed are broken; a fifth step of removing the sapphire substrate from the third intermediate to expose the first laser part and portions of the adhesive layer corresponding to the broken regions of the first laser part; and a sixth step of cleaving the third intermediate after the removal of the sapphire substrate, and dividing the resultant where the adhesive layer is exposed, thereby fabricating semiconductor laser devices each including a first light-emitting element having the first laser part and a second light-emitting element having the second laser part.

The method of manufacturing a semiconductor laser device according to a fourth aspect of the present invention (as set forth in claim 11) is a method of manufacturing a semiconductor laser device having a first laser part and a second laser part for emitting laser beams of different wavelengths, the method comprising: a first step of stacking thin films of group-III nitride compound semiconductors containing at least one selected from the group consisting of aluminum (Al), gallium (Ga), and indium (In), and nitrogen (N) on a sapphire substrate to form the first laser part, and forming a first adhesive layer on the first laser part to fabricate a first intermediate; a second step of stacking thin films of group III–V compound semiconductors containing at least one selected from the group consisting of aluminum (Al), gallium (Ga), and indium (In), and at least one selected from the group consisting of arsenic (As), phosphorus (P), and antimony (Sb) on a GaAs substrate to form the second laser part, forming an ohmic electrode layer of metal over the entire surface of the second laser part, and forming an adhesive layer on regions of the second laser part along waveguides thereof to fabricate a second intermediate, the regions including the waveguides; a third step of bonding the first adhesive layer and the second adhesive layer to each other, thereby fabricating a third intermediate in which the first laser part and the second laser part are bonded to each other through the interposition of an adhesive layer; a fourth step of irradiating a junction between the sapphire substrate and the first laser part with light to be transmitted through the sapphire substrate and absorbed by the group-III nitride compound semiconductors, so that the first laser part is decomposed in the vicinity of the junction, and portions of the first laser part corresponding to regions where the second adhesive layer is not formed are broken; a fifth step of removing the sapphire substrate from the third intermediate to expose the first laser part and portions of the ohmic electrode layer corresponding to the broken portions of the first laser part; and a sixth step of cleaving the third intermediate after the removal of the sapphire substrate, and dividing the resultant where the ohmic electrode layer is exposed, thereby fabricating semiconductor laser devices each including a first light-emitting element having the first laser part and a second light-emitting element having the second laser part.

BRIEF DESCRIPTION OF THE DRAWINGS

These and other objects and advantages of the present invention will become clear from the following description with reference to the accompanying drawings, wherein.

DETAILED DESCRIPTION OF THE PREFERRED EMBODIMENTS

Figure 1:
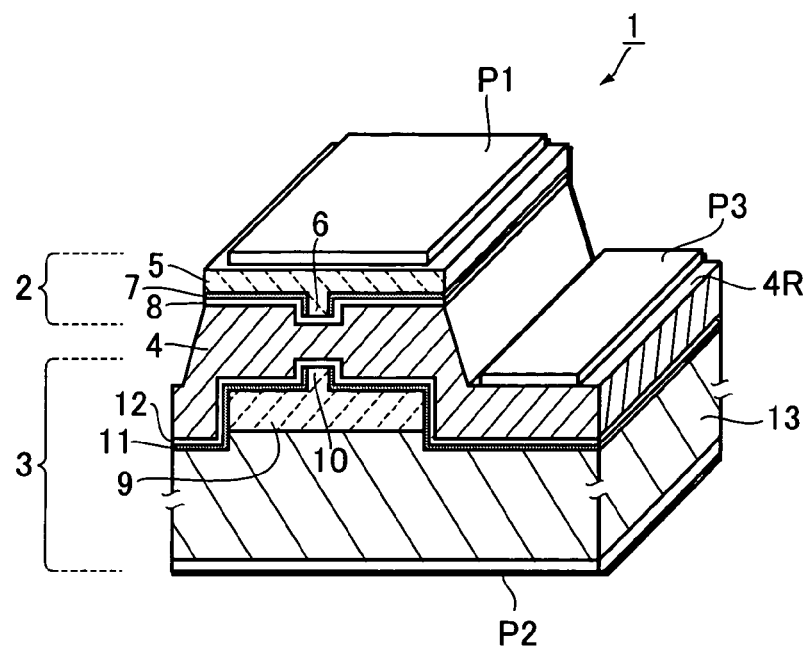
FIGS. 1A and 1B are diagrams showing the external structure and sectional structure of a semiconductor laser device according to a first embodiment.
Figure 1:
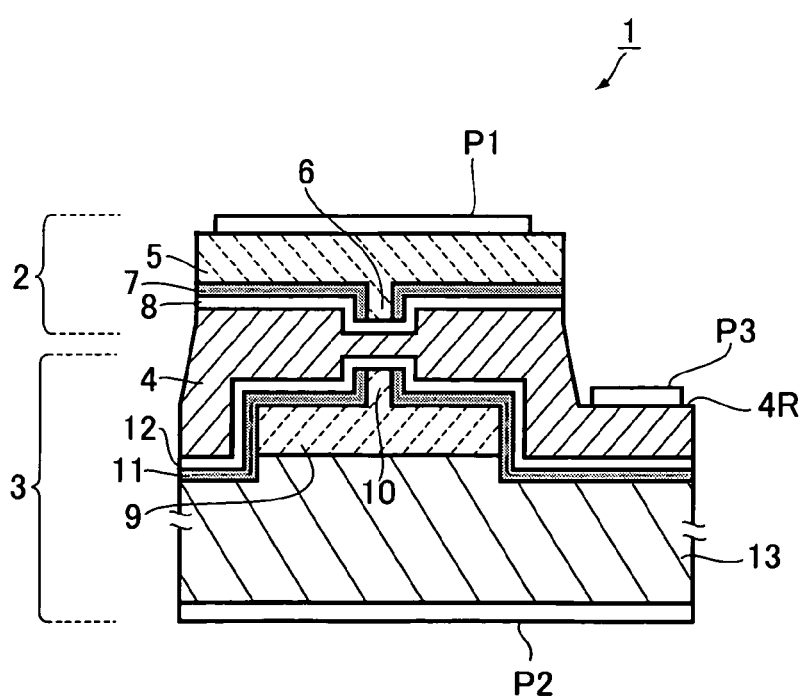
Figure 2:
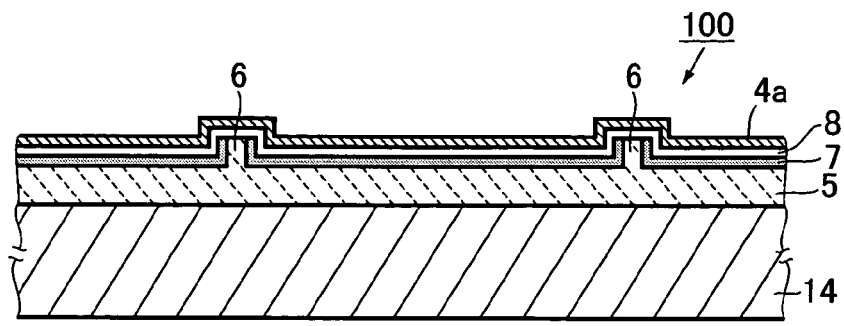
FIGS. 2A to 2C are sectional views for explaining the steps for manufacturing the semiconductor laser device shown in FIGS. 1A and 1B.
Figure 2:
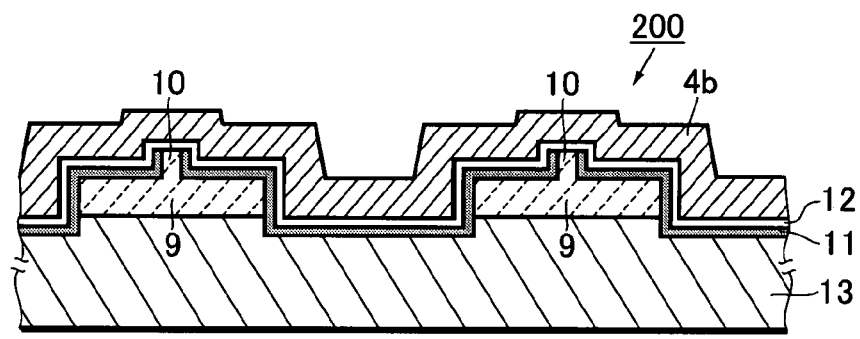
Figure 2:
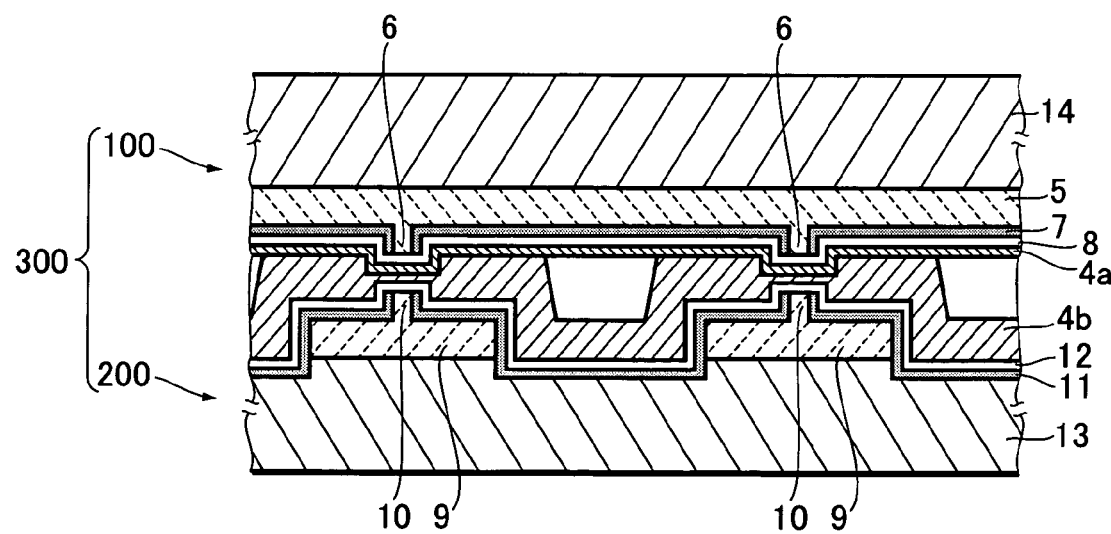
Figure 3:
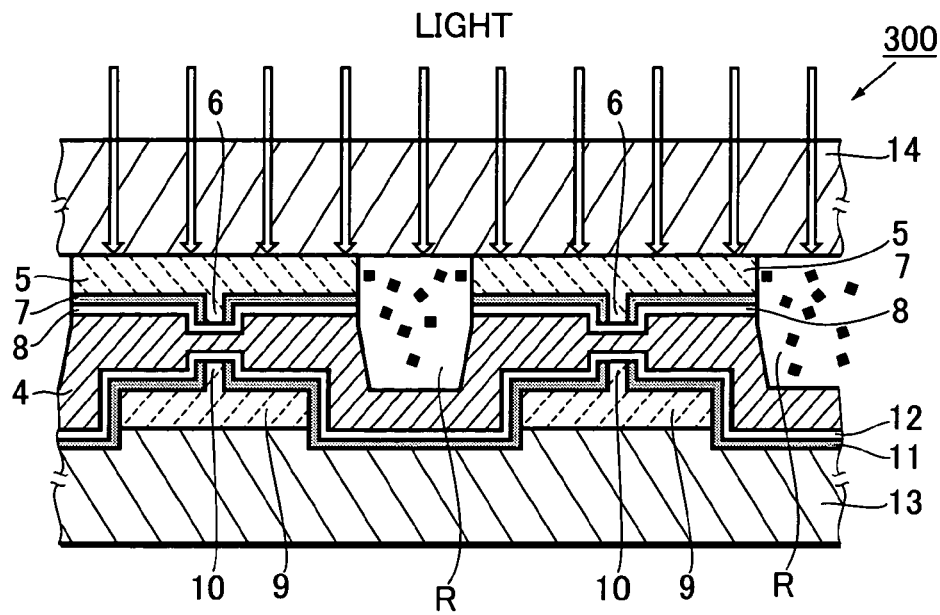
FIGS. 3A and 3B are sectional views for explaining the manufacturing steps subsequent to FIG. 2C.
Figure 3:
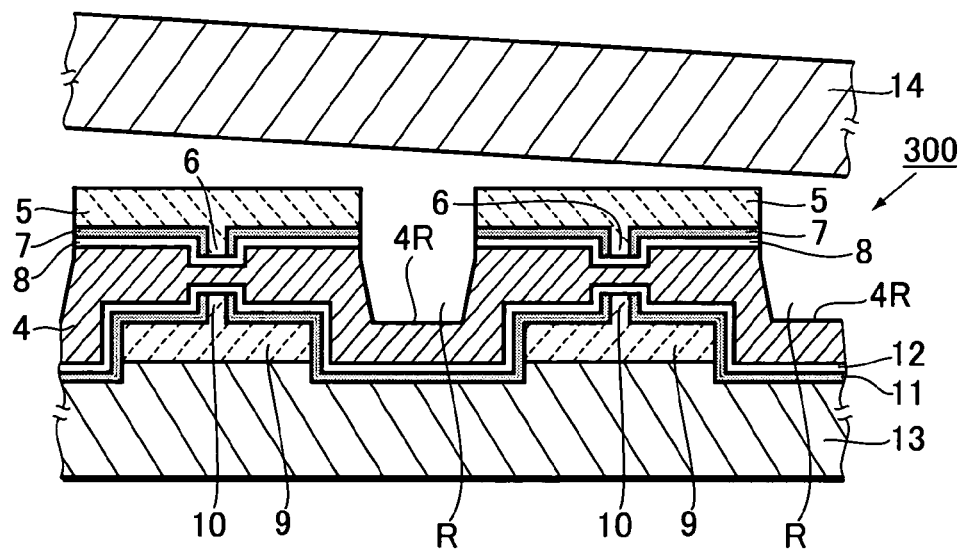
Figure 4:
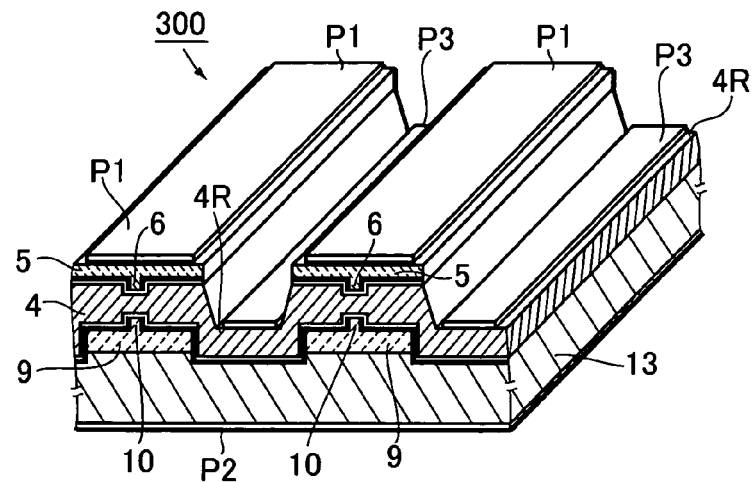
FIGS. 4A to 4C are sectional views for explaining the manufacturing steps subsequent to FIG. 3B.
Figure 4:
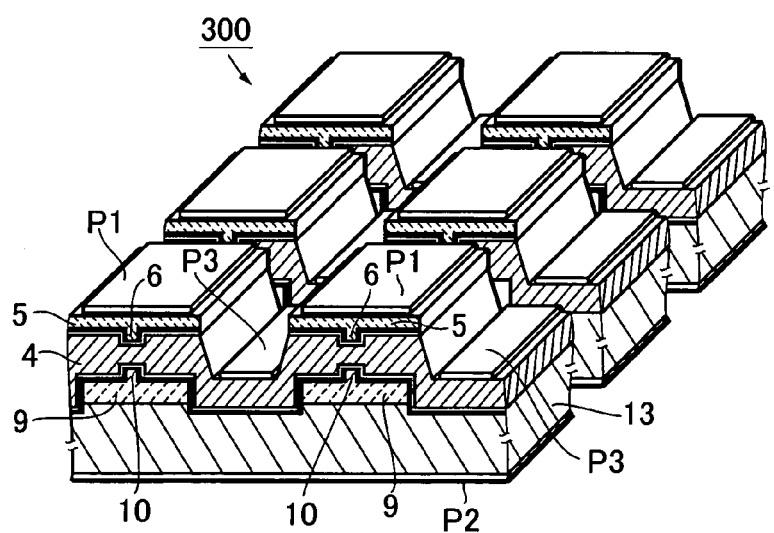
Figure 4:
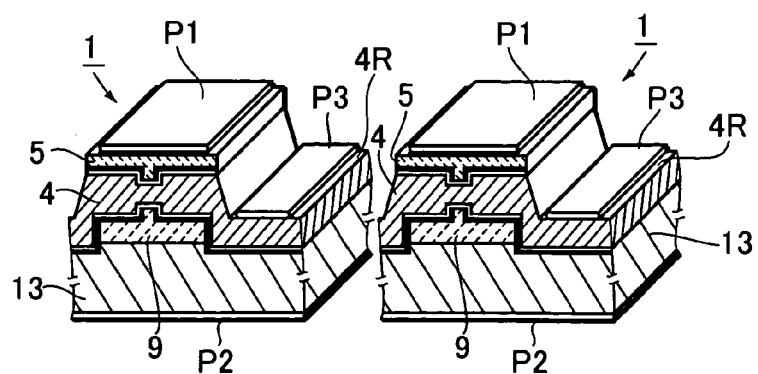

Hereinafter, embodiments of the present invention will be described with reference to the accompanying drawings.

[First Embodiment]

Description will now be given of a semiconductor laser device according to a first embodiment of the present invention with reference to FIGS. 1A to 4C.

FIG. 1A is a perspective view showing the external structure of the semiconductor laser device 1. FIG. 1B is a diagram showing the longitudinal sectional structure of the semiconductor laser device 1 shown in FIG. 1A. FIGS. 2A to 4C are diagrams showing the steps for manufacturing the semiconductor laser device 1.

In FIGS. 1A and 1B, this semiconductor laser device 1 has a hybrid structure in which a first light-emitting element 2 for emitting a laser beam of short wavelength (for example, in a 400-nm waveband) and a second light-emitting element 3 for emitting a laser beam of longer wavelength (for example, in a 600- to 700-nm waveband) are integrally bonded to each other by an adhesive metal layer 4, a conductive adhesive layer.

The first light-emitting element 2 comprises a first laser part 5, an insulating layer 7, an ohmic electrode layer 8, and an ohmic electrode P1. The first laser part 5 has a ridge waveguide 6, and emits the laser beam of short wavelength mentioned above. The insulating layer 7 insulates a surface of the laser part 5 facing toward the adhesive metal layer 4 entirely, except the ridge waveguide 6. The ohmic electrode layer 8 is electrically connected with the ridge wave guide 6 and the adhesive metal layer 4. The ohmic electrode P1 is formed on the surface of the laser part 5.

Here, the laser part 5 comprises a double-hetero (DH) structure, and the ridge waveguide 6 which is formed on the side facing toward the adhesive metal layer 4. The double-hetero structure includes an active layer of multiple quantum well structure which is made of group-III nitride compound semiconductors (GaN-based semiconductors), and two clad layers which are stacked with the active layer interposed therebetween.

When a drive current is supplied through the ohmic electrode P1 and an ohmic electrode P3 which is formed on an exposed portion 4R of the adhesive metal layer, the drive current flows through the adhesive metal layer 4. At the same time, a confined current flows into the active layer in the laser part 5 along the ridge waveguide 6 and causes light. The ridge waveguide 6 has cleavages (mirror faces) formed on both longitudinal ends, constituting a laser resonator. The light emitted along the ridge waveguide 6 is reflected by the cleavages (mirror faces) on both ends to travel back and forth through the active layer repeatedly, while inducing successive carrier recombinations for stimulated emission. As a result, the laser beam of short wavelength mentioned above is emitted from the cleavages.

The second light-emitting element 3 comprises a second laser part 9, an insulating layer 11, an ohmic electrode layer 12, and an ohmic electrode P2. The second laser part 9 is formed on a substrate 13 made of a group III–V compound semiconductor (for example, GaAs-based semiconductor), and has a ridge waveguide 10. The insulating layer 11 insulates the laser part 9, except the ridge waveguide 10, from the adhesive metal layer 4. The ohmic electrode layer 12 is electrically connected with the ridge waveguide 10 and the adhesive metal layer 4. The ohmic electrode P2 is formed on the bottom of the substrate 13.

Here, the laser part 9 comprises a double-hetero (DH) structure, with the ridge waveguide 10 which is formed on the side facing toward the adhesive metal layer 4. The double-hetero structure includes an active layer of strained quantum well structure which is made of group III–V compound semiconductors (AlGaInP-based semiconductors), and two clad layers which are stacked with the active layer interposed therebetween.

When a drive current is supplied through the ohmic electrodes P2 and P3, the drive current flows through the adhesive metal layer 4. At the same time, a confined current flows into the active layer in the laser part 9 along the ridge waveguide 10 and causes light. The ridge waveguide 10 has cleavages (mirror faces) formed on both longitudinal ends, which constitute a laser resonator. The light emitted along the ridge waveguide 10 is reflected by the cleavages (mirror faces) on both ends to travel back and forth through the active layer repeatedly, while inducing successive carrier recombinations for stimulated emission. As a result, the laser beam of long wavelength mentioned above is emitted from the cleavages.

Incidentally, the first and second light-emitting elements 2 and 3 are given high reflection coating on either one of the cleaved ends each.

Now, the steps for manufacturing the semiconductor laser device 1 having such a structure will be described with reference to FIGS. 2A to 4C.

Initially, as shown in a longitudinal sectional-view of FIG. 2A, an intermediate 100 for forming a plurality of first light-emitting elements 2 is fabricated in advance. As shown in a longitudinal sectional view of FIG. 2B, an intermediate 200 for forming a plurality of second light-emitting element 3 is fabricated in advance.

More specifically, in FIG. 2A, a plurality of semiconductor thin films made of GaN-based semiconductors having different compositions and thicknesses, for example, are stacked on a sapphire substrate 14 by MOCVD or the like. This forms the double-hetero (DH) structure having the active layer of multiple quantum well structure and the clad layers. The portions above the active layer are etched or otherwise processed selectively so that a plurality of ridge waveguides 6 are formed in parallel at a predetermined pitch.

As shown in the diagram, an insulating layer 7 is formed over the top portion excluding the ridge waveguides 6. Then, an ohmic electrode layer 8 and an adhesive metal layer 4*a* are formed in succession over the entire surface including the ridge waveguides 6 and the insulating layer 7 by such means as evaporation.

Through these manufacturing steps, the intermediate 100 capable of forming a plurality of first light-emitting elements 2 is fabricated.

Next, in FIG. 2B, a plurality of semiconductor thin films made of AlGaInP-based semiconductors having different compositions and thicknesses, for example, are stacked on a substrate 13 by MOCVD or the like. The substrate 13 is made of GaAs, for example. As a result, the double-hetero (DH) structure having the active layer of strained quantum well structure and the clad layers are formed. The portions above the active layer are then etched or otherwise processed selectively so that a plurality of ridge waveguides 10 are formed in parallel at the same pitch as that of the ridge waveguides 6.

As shown in the diagram, regions to be left for laser parts 9 are masked, and the remaining unmasked regions are etched or otherwise processed selectively. This forms grooves with a relatively great depth, forming a plurality of laser parts 9 each having a convex section.

An insulating layer 11 is formed over the top portion excluding the ridge waveguides 10. Then, an ohmic electrode layer 12 is formed over the entire surface including the ridge waveguides 10 and the insulating layer 11 by such means as evaporation. In addition, an adhesive metal layer 4*b* is formed on the ohmic electrode layer 12.

Through these manufacturing steps, the intermediate 200 capable of forming a plurality of second light-emitting elements 3 is fabricated. It follows that a plurality of laser parts 9 each having a convex section are formed on the substrate 13 at the same pitch as that of the ridge waveguides 10. The adhesive metal layer 4*b* is shaped convex in section over these laser parts 9 protruding from the substrate 13. The adhesive metal layer 4*b* is also shaped concave so as to wrap around the sides of the laser parts 9 to extend over the substrate 13 where no laser part 9 is formed.

After the intermediates 100 and 200 are thus fabricated in advance, the adhesive metal layers 4*a* and 4*b* are brought into contact to couple the intermediates 100 and 200 as shown in FIG. 2C.

Here, the intermediates 100 and 200 are coupled in advance so that the radiating spots, which are formed by such means as cleaving to be described later, of the laser parts 5 and 9 in each of the semiconductor laser device 1 lie close to each other. That is, preadjustment is made so as to reduce the distance between the light-emitting spots in each separated semiconductor laser device 1. For example, the intermediates 100 and 200 are coupled so that the ridge waveguides 6 and the ridge waveguides 10 formed at the predetermined pitch mentioned above are opposed and aligned to each other.

The intermediates 100 and 200 are pressed against each other under the application of a predetermined force, in which state the entire articles are heated to fuse the adhesive metal layers 4*a* and 4*b*, followed by heat removal. Consequently, the adhesive metal layers 4*a* and 4*b* shown in FIG. 2C are integrated into an adhesive metal layer 4. The intermediates 100 and 200 are bonded into an integral intermediate 300.

After the adhesive metal layers 4*a* and 4*b* are integrated into the adhesive metal layer 4, the junction between the sapphire substrate 14 and laser part 5 is irradiated with light which is transmitted through the sapphire substrate 14 and absorbed by group-III nitride compound semiconductors. As a result, the vicinity of the junction between the laser part 5 and the sapphire substrate 14 is heated. The heat decomposes this portion to weaken the joining force between the sapphire substrate 14 and the laser part 5 for easier removal.

The adhesive metal layer 4 creates gaps R due to its uneven section. Thus, the ohmic electrode layer 8, the insulating layer 7, and the laser part 5 facing the gaps R partially collapse into the gaps R under the force of gas which occurs from the decomposition of the semiconductor thin films. Consequently, the laser part 5 is separated into a plurality of laser parts 5 across the gaps R.

The sapphire substrate 14 is then removed from the intermediate 300, so that the plurality of laser parts 5 separated from each other across the gaps R and part of the adhesive metal layer 4 (concave portions) facing the gaps R are exposed.

Next, as shown in a perspective view of FIG. 4A, ohmic electrodes P1, P2, and P3 are formed on the exposed surfaces of the individual laser parts 5, the bottom of the substrate 13, and the exposed portions 4R of the adhesive metal layer 4, respectively, by such means as evaporation.

As shown in FIG. 4B, the intermediate 300 is cleaved in a direction perpendicular to the ridge waveguides 6 and 10 with predetermined intervals. Each cleaved piece is given high reflection coating at either one of the cleavages.

As shown in FIG. 4C, individual semiconductor laser devices 1 are further separated by scribing along the exposed portion of the adhesive metal layer 4 mentioned above. Thereby the semiconductor laser device 1 as shown in FIGS. 1A and 1B is fabricated.

As above, the semiconductor laser device 1 of the present embodiment has the structure that the laser parts 5 and 9 are bonded by the interposition of the adhesive metal layer 4. It is therefore possible to reduce the distance between the position of emission of the laser beam (the position of the light-emitting spot) at the laser part 5 and the position of emission of the laser beam (the position of the light-emitting spot) at the laser part 9, i.e., the distance between the light-emitting spots.

More specifically, the adhesive metal layer 4 has only to have a thickness necessary to bond the laser parts 5 and 9. Since an adhesive metal layer 4 extremely thinner than the substrates can be used to bond the laser parts 5 and 9, it is possible to reduce the distance between the light-emitting spots significantly.

The insulating layers 7, 11 and the ohmic electrode layers 8, 12 can also be reduced in thickness, considering their functions. This allows a significant reduction in the distance between the light-emitting spots.

According to the present embodiment, the laser parts 5 and 9 are bonded by the adhesive metal layer 4, part of which extends outside the laser parts 5 and 9 as the exposed portion 4R as shown in FIGS. 1A and 1B. This configuration facilitates providing a contact for supplying the drive currents.

The adhesive metal layer 4 functions as a so-called common electrode for supplying the drive currents to the laser parts 5 and 9. It is therefore possible to reduce the number of electrodes for supplying the drive currents.

According to the present embodiment, the first and second light-emitting elements 2 and 3 are not fabricated as respective semiconductor chips before bonding or the like. Instead, the intermediates 100 and 200 capable of fabricating a plurality of first and second light-emitting elements 2 and 3 are bonded into the integral intermediate 300 by the adhesive metal layer 4 before the intermediate 300 is separated into each individual semiconductor laser device 1 through cleaving, scribing, etc.

Consequently, in bonding the intermediates 100 and 200 by the adhesive metal layer 4 during the semiconductor manufacturing steps, the semiconductor laser devices 1 to be separated later can be controlled for an optimum distance between the light-emitting spots at a time. This also allows precise alignment of the light-emitting spots. Since the distances between the light-emitting spots can be controlled and optimized at a time, it is possible to achieve improved mass-producibility, uniform quality, and so on.

The laser parts 5 and 9 are arranged with their ridge waveguides 6 and 10 close to the adhesive metal layer 4, and the adhesive metal layer 4 is partially extended outward. This structure allows efficient dissipation of heat which occurs from the laser parts 5 and 9 at the time of laser emission.

When the semiconductor laser device 1 of the present embodiment is used as a light sauce of an optical pickup for data recording or data reproduction on CDs, DVDs, and other storage media, the smaller distance between the light-emitting spots makes it possible to align the light-emitting spots of the first and second light-emitting elements 2 and 3 to the optical axis of the optical system in the optical pickup with high precision. This provides such effects as a significant reduction of the occurrence of aberrations.

FIRST EXAMPLE

Now, a more concrete example according to the first embodiment will be described with reference to FIGS. 5 to 8B.

Figure 5:
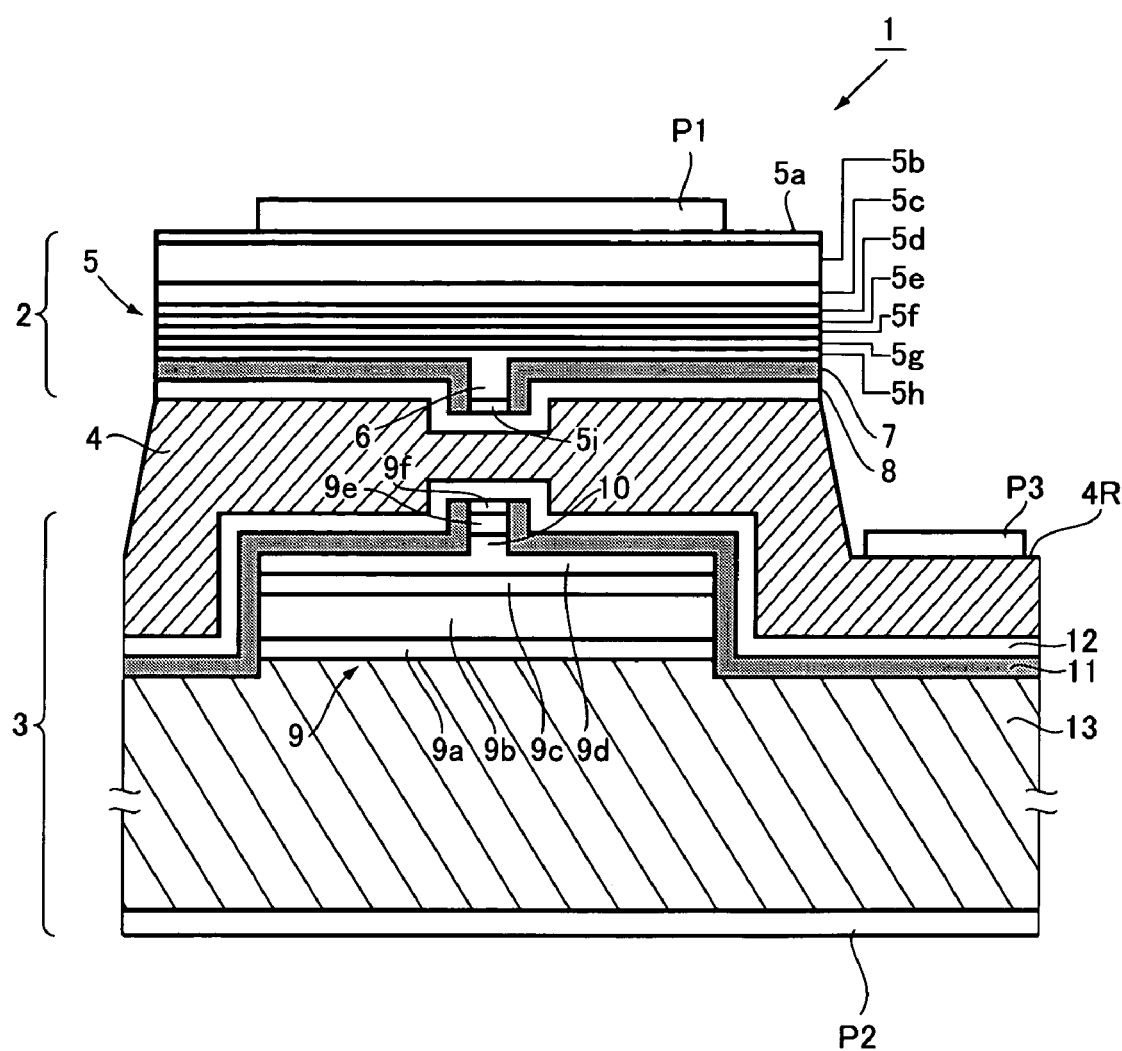
FIG. 5 is a sectional view showing the structure of the semiconductor laser device according to a first example.
Figure 6:
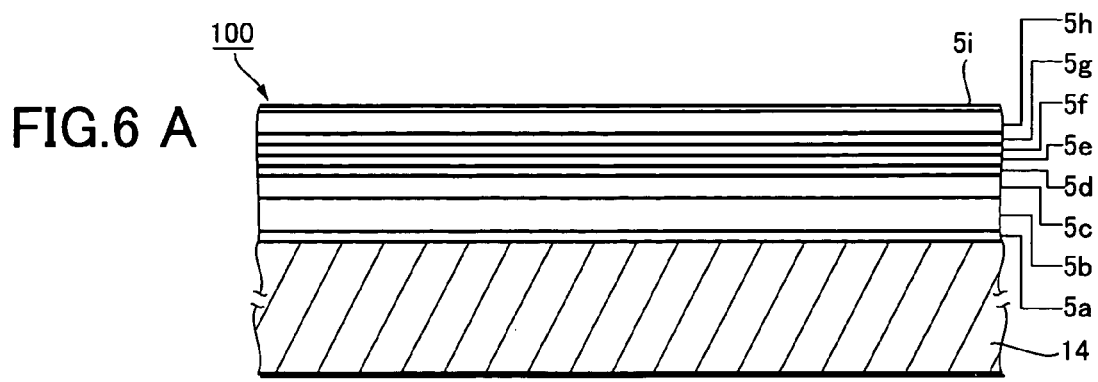
FIGS. 6A to 6C are sectional views for explaining the steps for manufacturing the semiconductor laser device shown in FIGS. 5(a) and 1B.
Figure 6:
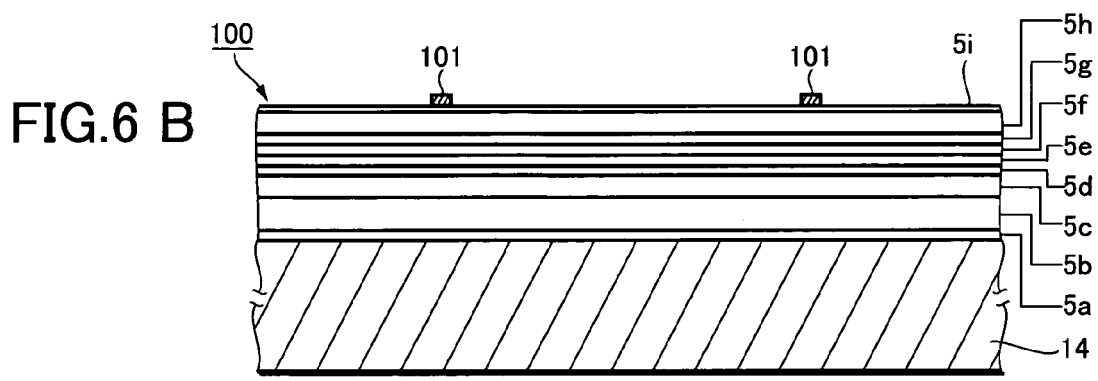
Figure 6:
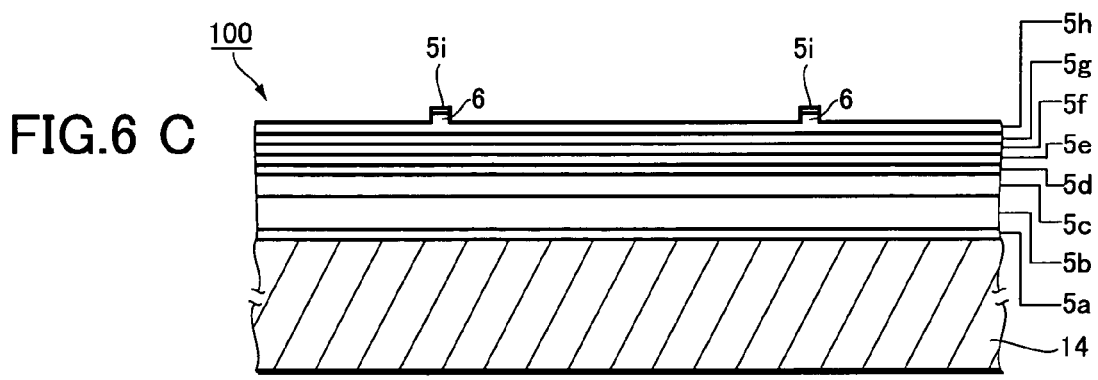
Figure 6:
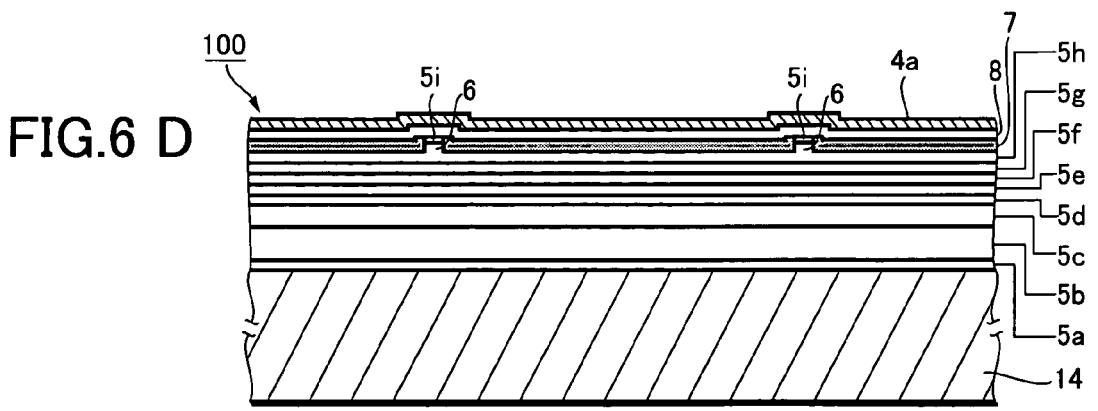
Figure 7:
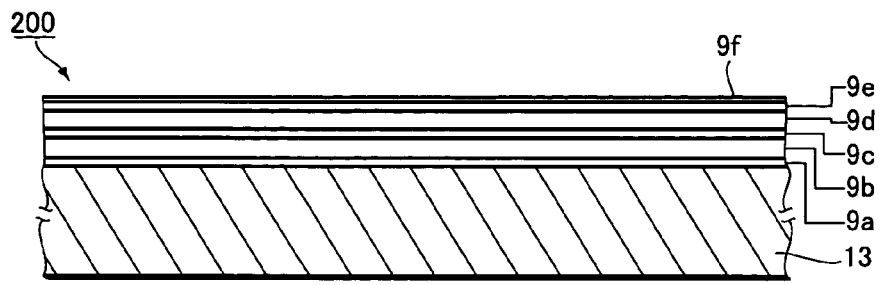
FIGS. 7A to 7D are sectional views and a perspective view for explaining the manufacturing steps subsequent to FIG. 6D.
Figure 7:
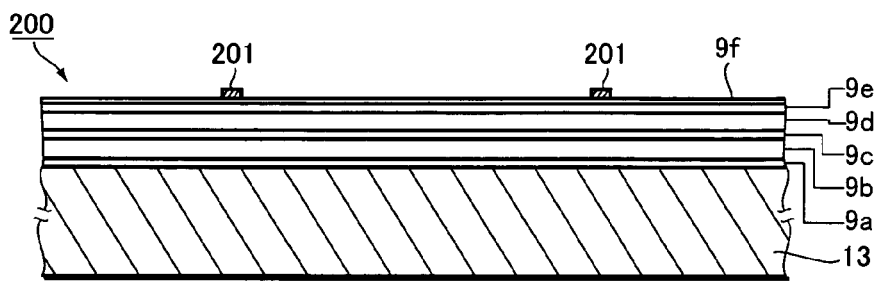
Figure 7:
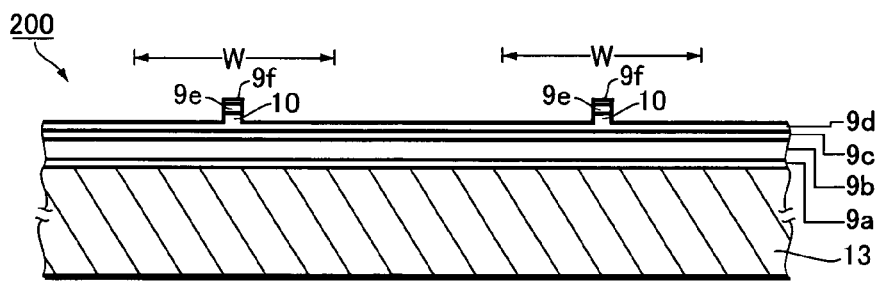
Figure 7:
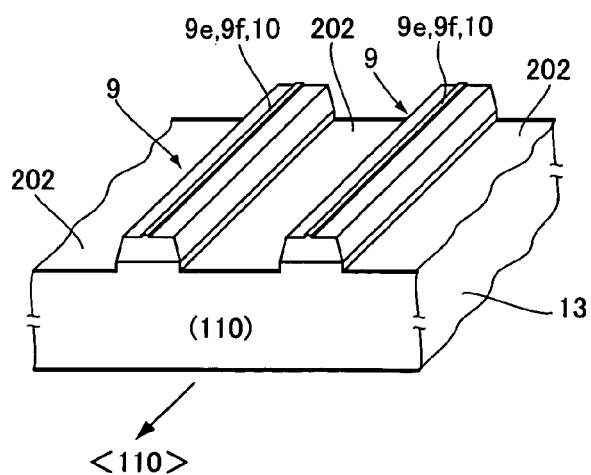
Figure 8:
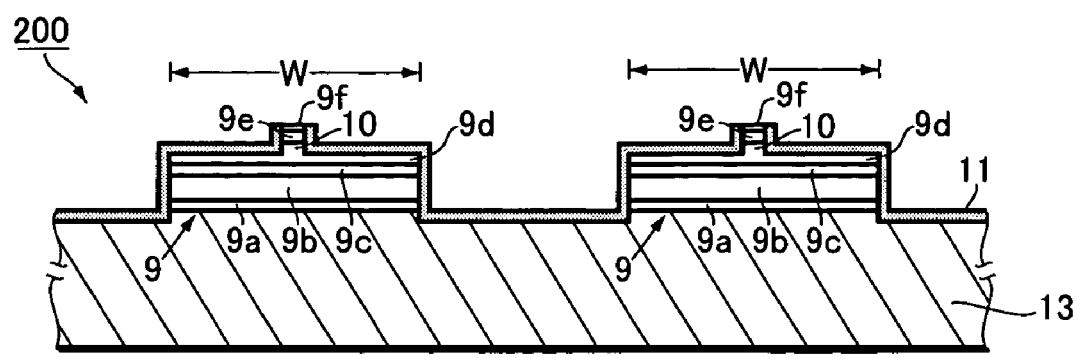
FIGS. 8A and 8B are sectional views for explaining the manufacturing steps subsequent to FIG. 7D.
Figure 8:
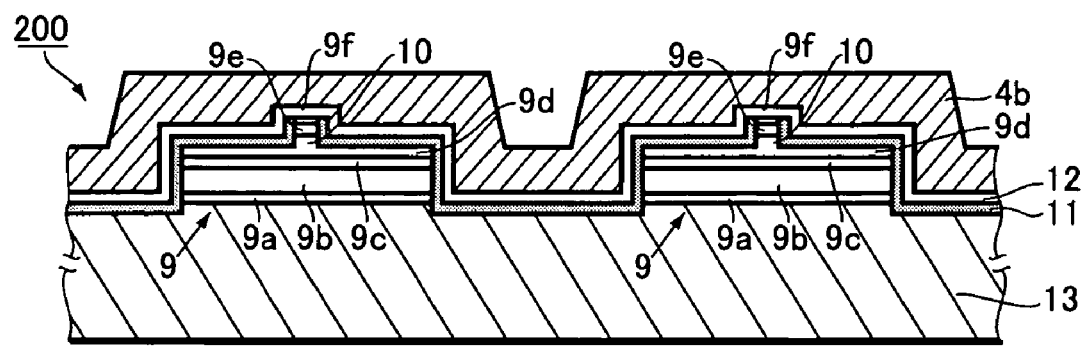

FIG. 5 is a longitudinal sectional view of a semiconductor laser device in this example, showing the structure thereof in a form corresponding to FIG. 1A. FIGS. 6A to 8B are diagrams showing the steps for manufacturing the semiconductor laser device. Incidentally, in FIGS. 5 to 8B, the parts identical or equivalent to those of FIGS. 1A to 3B are designated by the same reference numerals.

In FIG. 5, the semiconductor laser device 1 of this example has a hybrid structure in which a first light-emitting element 2, or a GaN-based laser (405-nm-band laser), and a second light-emitting element 3, or an AlGaInP-based laser (650-nm-band laser), are integrally bonded to each other by an adhesive metal layer 4.

The first light-emitting element 2 includes a laser part 5 which has a ridge waveguide 6. The second light-emitting element 3 includes a laser part 9 which is formed on an n-type GaAs substrate 13 and has a ridge waveguide 10.

Ohmic electrodes P1, P2, and P3 are formed on the top of the laser part 5, the bottom of the n-type GaAs substrate 13, and an exposed portion 4R of the adhesive metal layer 4, respectively.

When a drive current is supplied through the ohmic electrodes P1 and P3, the first light-emitting element 2 emits a 405-nm-band laser beam. When a drive current is supplied through the ohmic electrodes P2 and P3, the second light-emitting element 3 emits a 650-nm-band laser beam.

The laser part 5 of the first light-emitting element 2 has a multilayer structure in which a buffer layer $5a$, a bottom layer $5b$, an n-type clad layer $5c$, an n-type guide layer $5d$, an active layer $5e$, an electron barrier layer $5f$, a p-type guide layer $5g$, a p-type clad layer $5h$, and a p-type contact layer $5i$ are stacked in this order. The p-type contact layer $5i$ and the p-type clad layer $5h$ are partially removed by etching or the like, so that the ridge waveguide 6 mentioned above is formed in the shape of a stripe extending from the near side to the far side of the diagram.

An insulating layer 7 is formed over the entire surface of the p-type clad layer $5h$, except the ridge waveguide 6 and the p-type contact layer $5i$. In addition, an ohmic electrode layer 8 is formed all over the p-type contact layer $5i$, the ridge waveguide 6, and the insulating layer 7.

Consequently, the p-type contact layer $5i$ is electrically connected to the adhesive metal layer 4 through the ohmic electrode layer 8.

To be more specific, the buffer layer $5a$ is made of GaN or AlN, and has a thickness around several tens of nanometers. The bottom layer $5b$ is made of n-type GaN which is n-doped with Si, and has a thickness of approximately 5 to 15 µm. The n-type clad layer $5c$ is made of n-type $Al_{0.08}Ga_{0.92}N$, and has a thickness of approximately 0.8 µm. The n-type guide layer $5d$ is made of n-type GaN, and has a thickness of approximately 0.2 µm.

The active layer $5e$ is formed to a thickness around several tens of nanometers, and has a multiple quantum well structure including a well layer and a barrier layer which are made of $In_xGa_{1-x}N$ of different compositions (where $0 \leq x$) such as $In_{0.08}Ga_{0.92}N$ and $In_{0.01}Ga_{0.99}N$. The electron barrier layer 5f is made of AlGaN, and has a thickness of approximately 0.02 µm. The p-type guide layer 5g is made of p-type GaN which is p-doped with Mg, and has a thickness of approximately 0.2 µm.

The p-type clad layer 5h is made of p-type $Al_{0.08}Ga_{0.92}N$, and has a thickness of approximately 0.4 µm. The p-type contact layer 5i is made of p-type GaN, and has a thickness of approximately 0.1 µm.

The ohmic electrode layer 8 is made of any one of Pd, Pt, Au, and Ni, or an alloy of their combination. The insulating layer 7 is made of $SiO_2$ or the like.

As will be detailed in the description of the manufacturing steps, the adhesive metal layer 4 is made of an alloy which is generated by alloying of an Au adhesive metal layer 4a and an Sn adhesive metal layer 4b.

The laser part 9 of the second light-emitting element 3 has a multilayer structure in which a buffer layer 9a, an n-type clad layer 9b, an active layer 9c, a p-type clad layer 9d, an smoothing layer 9e, and a p-type contact layer 9f are stacked in this order on the n-type GaAs substrate 13.

The p-type contact layer 9f, the smoothing layer 9e, and the p-type clad layer 9d are partially removed by etching or the like, so that the ridge waveguide 10 mentioned above is formed in the shape of a stripe extending from the near side to the far side of the diagram. After the formation of the ridge waveguide 10, the region for forming the laser part 9 including the ridge waveguide 10 is masked, and the remaining unmasked region is etched into a relatively great depth of the n-type GaAs substrate 13. This forms the laser part 9 having a convex section as shown in the diagram.

Then, the laser part 9 and the n-type GaAs substrate 13 are covered with the insulating layer 11 all over, excluding the p-type contact layer 9f, as mentioned above. In addition, an ohmic electrode layer 12 is formed all over the p-type contact layer 9f and the insulating layer 11. The p-type contact layer 9f are thus electrically connected to the ohmic electrode layer 12 and, through the ohmic electrode layer 12, the adhesive metal layer 4 as well.

To be more specific, the buffer layer 9a is made of n-type GaAs which is n-doped with Si, and has a thickness of approximately 0.5 µm. The n-type clad layer 9b is made of n-type $Al_{0.35}Ga_{0.15}In_{0.5}P$, and has a thickness of approximately 1.2 µm.

The active layer 9c is formed to a thickness around several tens of nanometers, and has a strained quantum well structure made of GaInP and AlGaInP. The p-type clad layer 9d is made of $Al_{0.35}Ga_{0.15}In_{0.5}P$ p-doped with Zn, and has a thickness of approximately 1.2 µm. The smoothing layer 9e is made of p-type $Ga_{0.51}In_{0.49}P$, and has a thickness of approximately 0.05 µm. The p-type contact layer 9f is made of p-type GaAs, and has a thickness of approximately 0.2 µm.

The ohmic electrode layer 12 is made of any one of Ti, Pt, Cr, Au, and Au—Zn, or an alloy of their combination. The insulating layer 7 is made of $SiO_2$ or the like.

Next, the steps for manufacturing the semiconductor laser device 1 of this example will be described with reference to FIGS. 6A to 8B.

Initially, an intermediate 100 for forming a plurality of first light-emitting elements 2 is fabricated through the steps shown in FIGS. 6A to 6D. An intermediate 200 for forming a plurality of second light-emitting elements 3 is fabricated through the steps shown in FIGS. 7A to 7D and FIGS. 8A, 8B.

In FIG. 6A, GaN-based thin films for forming the laser part 5 are stacked on a monocrystalline sapphire (0001) substrate 14 by MOCVD so that the intermediate 100 is fabricated.

More specifically, the following layers are stacked on the monocrystalline sapphire (0001) substrate 14 in the order listed: a buffer layer 5a made of GaN or AlN, having a thickness around several tens of nanometers; a bottom layer 5b made of n-type GaN n-doped with Si, having a thickness of approximately 5 to 15 µm; an n-type clad layer 5c made of n-type $Al_{0.08}Ga_{0.92}N$, having a thickness of approximately 0.8 µm; an n-type guide layer 5d made of n-type GaN, having a thickness of approximately 0.2 µm; an active layer 5e having the multiple quantum well structure including a well layer made of $In_{0.08}Ga_{0.92}N$ and a barrier layer made of $In_{0.01}Ga_{0.99}N$; an electron barrier layer 5f made of AlGaN, having a thickness of approximately 0.02 µm; a p-type guide layer 5g made of p-type GaN p-doped with Mg, having a thickness of approximately 0.2 µm; a p-type clad layer 5h made of p-type $Al_{0.08}Ga_{0.92}N$, having a thickness of approximately 0.4 µm; and a p-type contact layer 5i made of p-type GaN, having a thickness of approximately 0.1 µm.

Next, as shown in FIG. 6B, a mask 101 tailored to the configuration of a plurality of ridge waveguides 6 (see FIG. 5) is formed on the p-type contact layer 5i of the intermediate 100. The portions exposed from the mask 101 are etched by RIE (reactive ion etching).

Here, as shown in FIG. 6C, the etching is performed to such a depth that the p-type clad layer 5h is reduced to the order of approximately 0.05 µm in thickness. As a result, the plurality of ridge waveguides 6 protruding from the p-type clad layer 5h are formed in stripes at the same pitch as that of the plurality of laser parts 5 to be formed. Then, the mask 101 is removed.

Next, as shown in FIG. 6D, an $SiO_2$ insulating layer 7 is formed on the entire top surface of the intermediate 100 by sputtering or the like, excluding the p-type contact layer 5i which remains on the top of individual ridge waveguides 6. Any one of Pd, Pt, Au, and Ni, or an alloy of their combination is then evaporated on the p-type contact layer 5i and the insulating layer 7 to a thickness of approximately 200 nm, thereby forming an ohmic electrode layer (p-side electrode layer) 8. An adhesive metal layer 4a made of Au, having a thickness of approximately 200 nm is evaporated on the entire surface of the ohmic electrode layer 8 to complete the intermediate 100.

Description will now be given of the intermediate 200. Initially, as shown in FIG. 7A, AlGaInP-based thin films for forming the laser part 9 are stacked on an n-type GaAs (001) substrate 13 by MOCVD.

More specifically, the following layers are stacked on the n-type GaAs substrate 13 in the order listed: a buffer layer 9a made of n-type GaAs n-doped with Si, having a thickness of approximately 0.5 µm; an n-type clad layer 9b made of n-type $Al_{0.35}Ga_{0.15}In_{0.5}P$, having a thickness of approximately 1.2 µm; an active layer 9c having a strained quantum well structure made of GaInP and AlGaInP; a p-type clad layer 9d made of $Al_{0.35}Ga_{0.15}In_{0.5}P$ p-doped with Zn, having a thickness of approximately 1.2 µm; a smoothing layer 9e made of p-type $Ga_{0.51}In_{0.49}P$, having a thickness of approximately 0.05 µm; and a p-type contact layer 9f made of p-type GaAs, having a thickness of approximately 0.2 µm.

Next, as shown in FIG. 7B, a mask 201 tailored to the configuration of a plurality of ridge waveguides 10 (see FIG. 5) is formed on the p-type contact layer 9f of the intermediate 200, at the same pitch as that of the ridge waveguides 6 shown in FIGS. 6C and 6D. The portions exposed from the mask 201 are etched by RIE (reactive ion etching).

Here, as shown in FIG. 7C, the etching is performed to such a depth that the p-type clad layer 9d is reduced to the order of approximately 0.2 μm in thickness. As a result, the plurality of ridge waveguides 10 protruding from the p-type clad layer 9d are formed in stripes at the same pitch as that of the laser parts 9 to be formed. Then, the mask 201 is removed.

Next, a mask (not shown) is formed on regions W for forming the plurality of laser parts 9. The portions exposed from this mask are etched by wet etching. Specifically, the regions W to be masked are given a width of approximately 200 μm or so, and etched in an etchant which contains (sulfuric acid):(oxygenated water):water of 4:1:1 in ratio.

Here, as shown in a perspective view of FIG. 7D, the etching is performed so that the n-type GaAs substrate 13 is etched to a relatively great depth, forming grooves 202 along the direction <110>. The masks (not shown) formed on the regions W are then removed.

Next, as shown in FIG. 8A, an $SiO_2$ insulating layer 11 is formed over the laser parts 9 and the n-type GaAs substrate 13 by sputtering or the like, excluding the p-type contact layer 9f on the top of the ridge waveguides 10.

As shown in FIG. 8B, any one of Ti, Pt, Cr, Au, and Au—Zn, or an alloy of their combination is evaporated on the p-type contact layer 9 and the insulating layer 11 to a thickness of approximately 200 nm, thereby forming an ohmic electrode layer (p-side electrode layer) 12. An adhesive metal layer 4b made of Sn, having a thickness of approximately 1 μm is further formed thereon.

When the intermediates 100 and 200 are fabricated thus, the intermediate 100 shown in FIG. 6D has the same structure as shown in FIG. 2A. The intermediate 200 shown in FIG. 8B has the same structure as shown in FIG. 2B.

That is, in FIG. 2A, the laser part 5 shown hatched with broken lines has the structure including the GaN-based thin films 5a to 5i and the ridge waveguides 6 shown in FIG. 6D. In FIG. 2B, the laser parts 9 shown hatched with broken lines have the structure including the AlGaInP-based thin films 9a to 9f and the ridge waveguides 10 shown in FIG. 8B.

Next, the intermediates 100 and 200 shown in FIGS. 6D and 8B are coupled as is shown in FIG. 2C, with their ridge waveguides 6 and 10 opposed to each other and their adhesive metal layers 4a and 4b in contact with each other. The intermediates 100 and 200 are also coupled so that after the cleaving to be described later, the cleavage (1-100) of the GaN-based thin films 5a to 5i and the cleavage (110) of the AlGaInP-based thin films 9a to 9f coincide with each other. The intermediates 100 and 200 are also coupled in advance so that when the individual laser devices 1 are separated by such means as the cleaving to be described later, the emitting spots of the laser beams on the laser parts 5 and 9 in each of the semiconductor laser devices 1 lie close to each other.

Then, in the same state as shown in FIG. 2C, the intermediates 100 and 200 are pressed against each other under the application of a predetermined force. The entire articles are heated at approximately 300° C., followed by heat removal. Consequently, the adhesive metal layer 4a of Au and the adhesive metal layer 4b of Sn fuse with each other to generate an adhesive metal layer 4 made of an Au—Sn alloy. The heat removal sets the adhesive metal layer 4 to fabricate an intermediate 300 in which the intermediates 100 and 200 are integrally bonded to each other.

Next, as is shown in FIG. 3A, the junction between the sapphire substrate 14 and laser part 5 is irradiated with the light which is transmitted through the sapphire substrate 14 and absorbed by GaN-based compound semiconductors. In this example, quarter-wave YAG laser (266 nm in wavelength) is condensed into a high-energy beam by a predetermined condenser lens. From the backside of the sapphire substrate 14, the high-energy beam is projected onto the portion of the laser part 5 near the junction between the sapphire substrate 14 and the laser part 5.

The beam having a wavelength of 226 nm, when projected thus, is transmitted through the sapphire substrate 14 with little absorption, and is absorbed by the vicinity of the junction with a slight depth of penetration. Due to a large lattice mismatch between the sapphire substrate 14 and GaN, the GaN near the junction has quite a number of crystal defects. Consequently, most of the absorbed beam is converted into heat, which heats the buffer layer 5a and the like in the vicinity of the junction to high temperatures and decomposes GaN into gallium metal and nitrogen gas.

Here, there are air gaps R at the regions where the adhesive metal layer 4 is not formed. Then, the ohmic electrode layer 8, the insulating layer 7, and the laser part 5 facing the gaps R collapse into the gaps R and the like because of gas which occurs from the decomposition of the GaN. Consequently, the laser part 5 is separated into a plurality of laser parts 5 across the gaps R.

In the regions where the laser parts 5 and the adhesive metal layer 4 are in contact, the laser parts 5 and the sapphire substrate 14 are weakly joined by gallium metal. The intermediate 300 is thus heated to temperatures of approximately 30° C. which is higher than the melting point of gallium, so that the sapphire substrate 14 is removed from the intermediate 300.

By means of the removal process as mentioned above, the individual laser parts 5 separated across the gaps R are transferred to the laser parts 9, and the removal sides of the laser parts 5 are exposed. The adhesive metal layer 4 is also exposed beside the laser parts 5 and 9 where it is shaped concave in section along the grooves 202 in the n-type GaAs substrate 13. In other words, the adhesive metal layer 4 at the portions which corresponds to the gaps R is exposed.

Next, the intermediate 300 from which the sapphire substrate 14 has been removed is ultrasonic cleaned in pure water to eliminate the collapsed pieces and the like of the laser parts 5. Subsequently, the intermediate 300 is immersed in dilute hydrochloric acid for about three minutes to eliminate residual gallium metal on the surfaces of the laser parts 5 from which the sapphire substrate 14 is removed, and to clean the intermediate 300 all over.

After the cleaning described above, as is shown in FIG. 4A, ohmic electrodes P1 made of any one of Ti, Al, and Au, or an alloy of their combination are formed on the exposed surfaces (of n-type GaN) of the respective laser parts 5 by such means as evaporation. An ohmic electrode P2 made of AuGe, Ni, or Au, or an alloy of their combination is formed on the bottom of the n-type GaAs substrate 13 by such means as evaporation.

Next, as shown in FIG. 4B, the intermediate 300 is cleaved in a direction perpendicular to the ridge waveguides 6 and 10 with predetermined intervals. Here, the cleaving is performed along the (1-100) planes which are the cleavable planes of the laser parts 5, and which comprise the multilayer structure of the GaN-based thin films. High reflection coating such as dielectric thin films is given to either one of the cleavages to form laser resonators.

Next, as is shown in FIG. 4C, scribing is performed along the exposed portions 4R of the adhesive metal layer 4, whereby individual semiconductor laser devices 1 having the structure shown in FIG. 5 are fabricated.

As above, according to the semiconductor laser device 1 of this example, the laser parts 5 and 9 are bonded by the interposition of the adhesive metal layer 4 having a small thickness as shown in FIG. 5. This structure allows a reduction in the distance between the light-emitting spots of these laser parts 5 and 9.

Besides, according to this example, the exposed portion 4R of the adhesive metal layer 4 is extended and exposed outside the laser part 5 and 9. This facilitates providing a contact for supplying the drive currents.

The adhesive metal layer 4 functions as a so-called common electrode for supplying the drive currents to the laser parts 5 and 9. It is therefore possible to reduce the number of electrodes and leads for supplying the drive currents.

According to the manufacturing method of this example, the intermediates 100 and 200 capable of forming a plurality of first and second light-emitting elements 2 and 3 are bonded by the adhesive metal layer 4 before the resultant is separated into the individual semiconductor laser devices 1 by cleaving, scribing, etc. The distances between the light-emitting spots of the light-emitting devices 2 and 3 can thus be controlled and optimized at a time for a plurality of pair of first and second light emitting elements 2 and 3 in bonding the intermediates 100 and 200. The alignment can also be performed with high precision.

The laser parts 5 and 9 are arranged with their ridge waveguides 6 and 10 close to the adhesive metal layer 4, and part of the adhesive metal layer 4 is extended outward for exposition. This structure allows efficient dissipation of heat which occurs at the laser parts 5 and 9.

When the semiconductor laser device 1 of this example is used as a light source of an optical pickup for data recording or data reproduction on CDs, DVDs, and other storage media, the smaller distance between the light-emitting spots makes it possible to align the light-emitting spots of the first and second light-emitting elements 2 and 3 to the optical axis of the optical system in the optical pickup with high precision. This provides such effects as a significant reduction of the occurrence of aberrations.

SECOND EXAMPLE

Figure 9:
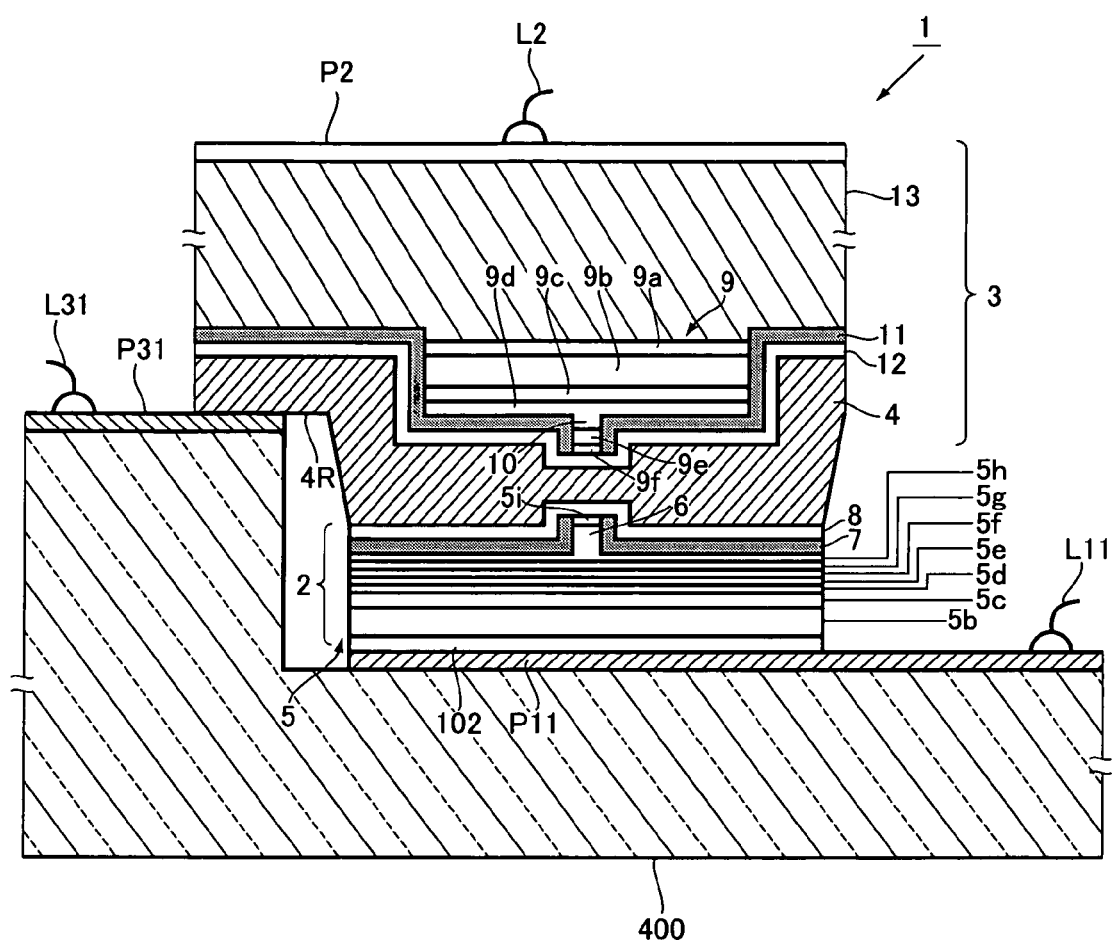
FIG. 9 is a sectional view showing the structure of a semiconductor laser device according to a second example.

Next, a second example according to the first embodiment will be described with reference to FIG. 9. FIG. 9 is a longitudinal sectional view showing the structure of the semiconductor laser device of this example, in which the parts identical or equivalent to those of FIG. 5 are designated by the same reference numerals.

In FIG. 9, this semiconductor laser device corresponds to a modified example of the first example, having the structure that the semiconductor laser device 1 shown in FIG. 5 is bonded to an electrically-insulative support substrate (submount) 400 of ceramic or the like having high thermal conductivity.

The support substrate 400 has a step. An adhesive metal layer P11 and an adhesive metal layer P31 are formed on the lower face (hereinafter, referred to as "first face") and the upper face (hereinafter, referred to as "second face"), respectively.

The difference in height between the first and second faces is rendered almost the same as the difference in height between the bottom layer 5b of the first light-emitting element 2 and the exposed portion 4R of the adhesive metal layer 4. The adhesive metal layers P11 and P31 mentioned above are formed by laminating metal of high electric and thermal conductivities on the first and second faces by such means as evaporation.

The bottom layer 5b and the adhesive metal layer P11 are electrically bonded to each other through an ohmic electrode layer 102 which is made of Au or the like. The exposed portion 4R of the adhesive metal layer 4 and the adhesive metal layer P31 are electrically bonded to each other. Leads L11 and L31 for supplying a drive current are connected to the adhesive metal layers P11 and P31, respectively.

When a drive current is supplied through the leads L11 and L31, the drive current flows through the adhesive metal layers P11 and P31, the ohmic electrode layer 102, and the adhesive metal layer 4. Meanwhile, the current confined by the ridge waveguide 6 flows into the active layer 5e of the laser part 5 to cause light, so that the first light-emitting element 2 emits a 405-nm-band laser beam.

A lead L2 is connected to the ohmic electrode P2 on the GaAs substrate 13. When a drive current is supplied through the leads L31 and L2, the drive current flows through the ohmic electrode P2 and the adhesive metal layer 4. Meanwhile, the current confined by the ridge waveguide 10 flows into the active layer 9c of the laser part 9 to cause light, so that the second light-emitting element 3 emits a 650-nm-band laser beam.

As above, according to the semiconductor laser device of this example, the laser parts 5 and 9 of the first and second light-emitting elements 2 and 3 are bonded to the support substrate 400 which has a step. Heat of the laser parts 5 and 9 occurring during their light emission can thus be dissipated with high efficiency.

In particular, since the laser part 9, an AlGaInP-based laser of low thermal conductivity, is located away from the support substrate 400, the heat occurring from the laser part 9 must be dissipated with high efficiency. Two heat dissipation paths, or a first heat dissipation path for dissipating heat through the exposed portion 4R of the adhesive metal layer 4 to the support substrate 400 and a second heat dissipation path for dissipating heat through the adhesive metal layer 4 and the laser part 5 to the support substrate 400, allow efficient dissipation of the heat occurring from the laser part 9.

More specifically, the laser part 9 is almost entirely surrounded by the adhesive metal layer 4 which has favorable heat conductivity. Besides, the exposed portion 4R of the adhesive metal layer 4 is connected to the adhesive metal layer P31 on the support substrate 400. The heat occurring from the laser part 9 can thus be efficiently dissipated to the support substrate 400 through the first heat dissipation path mentioned above. In addition, the laser part 5 lying between the adhesive metal layer 4 and the support substrate 400 is extremely thin, and has no substrate such as described in the prior art. The heat occurring from the laser part 9 can thus be efficiently dissipated to the support substrate 400 through the adhesive metal layer 4 and the laser part 5 (i.e., through the second heat dissipation path mentioned above).

As above, the semiconductor laser device of this example is not just the semiconductor laser device 1 shown in FIG. 5 simply mounted on the support substrate 400, but one having the structure for excellent heat dissipation effect.

According to this example, part of the adhesive metal layer 4 (namely, the exposed portion 4R) is exposed outside the laser parts 5 and 9. This facilitates bonding the support substrate 400 and the semiconductor laser device 1, and thus allows simplified manufacturing steps and the like.

Furthermore, as is described in the first example, the laser part 5 of the first light-emitting element 2 and the laser part 9 of the second light-emitting element 2 are bonded by the interposition of the adhesive metal layer 4 which has a small thickness. This structure allows a reduction in the distance between the light-emitting spots of the laser parts 5 and 9. It is therefore possible to provide a semiconductor laser device which is suitably applicable to an optical pickup for data recording or data reproduction on storage media such as CDs and DVDs, for example.

[Second Embodiment]

Now, a second embodiment of the present invention will be described with reference to FIGS. 10A to 12C.

Figure 10:
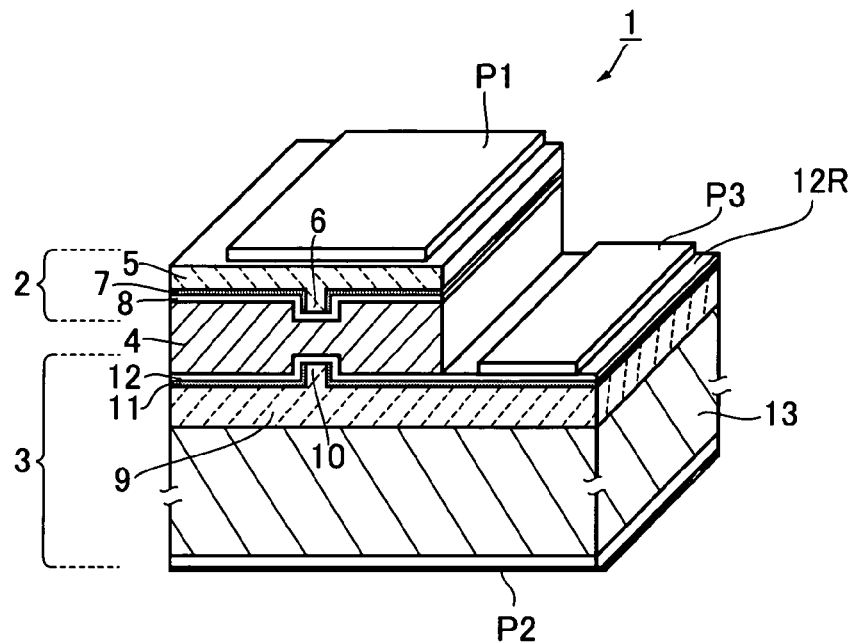
FIGS. 10A and 10B are diagrams showing the external structure and sectional structure of the semiconductor laser device according to a second embodiment.
Figure 10:
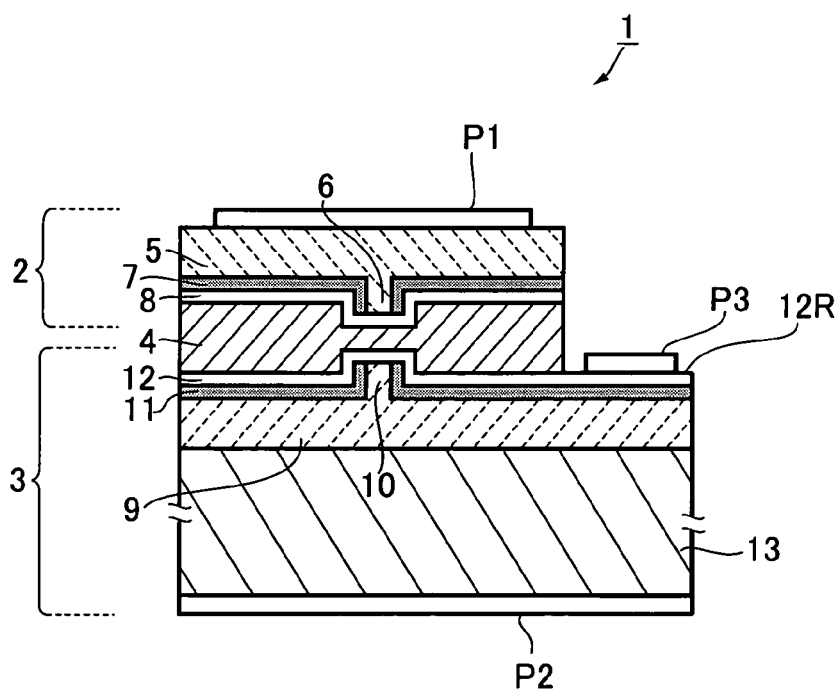
Figure 11:
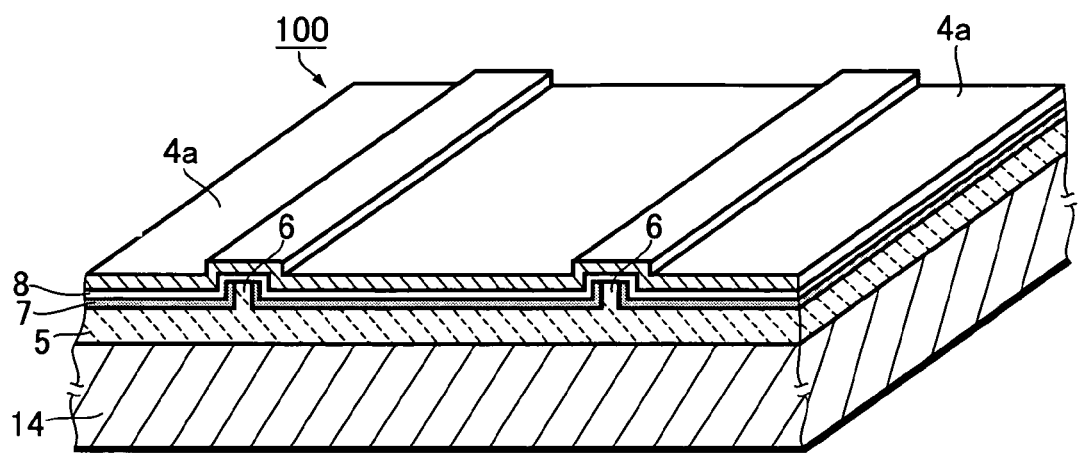
FIGS. 11A and 11B are perspective views for explaining the steps for manufacturing the semiconductor laser device shown in FIGS. 10A and 10B.
Figure 11:
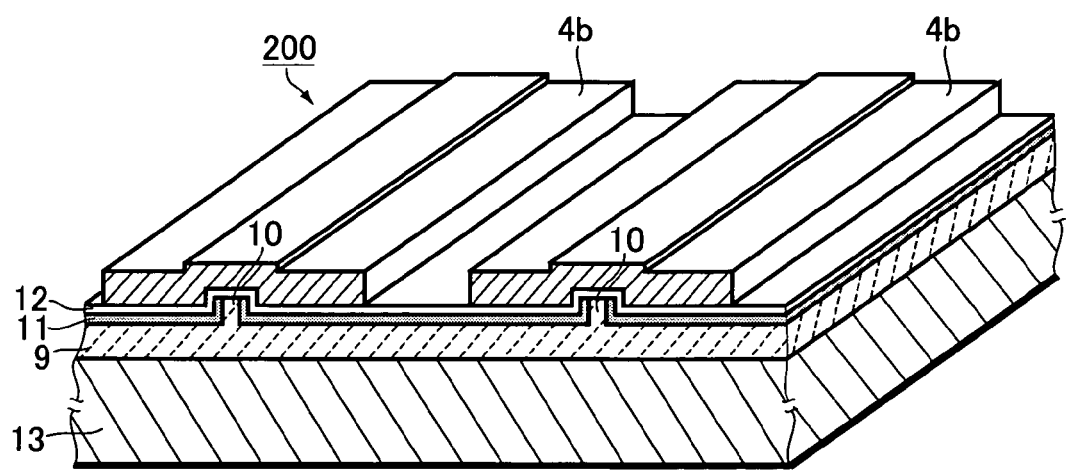
Figure 12:
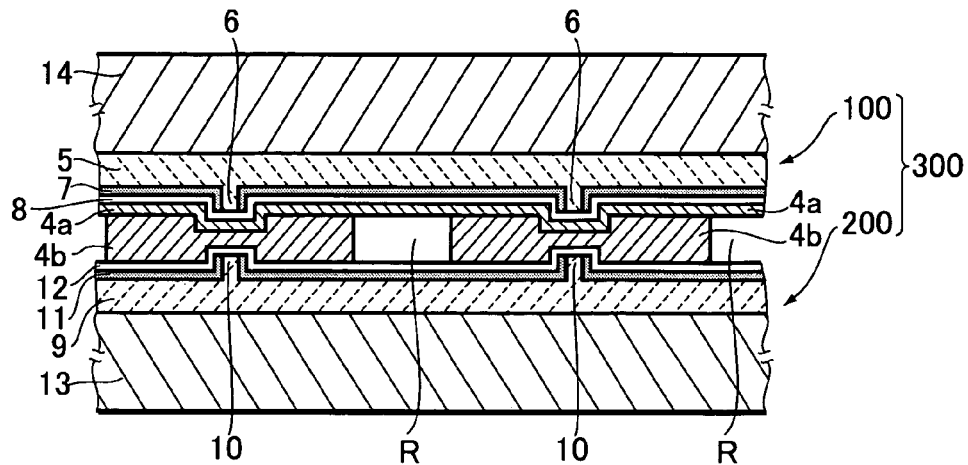
FIGS. 12A to 12C are sectional views for explaining the manufacturing steps subsequent to FIG. 11B.
Figure 12:
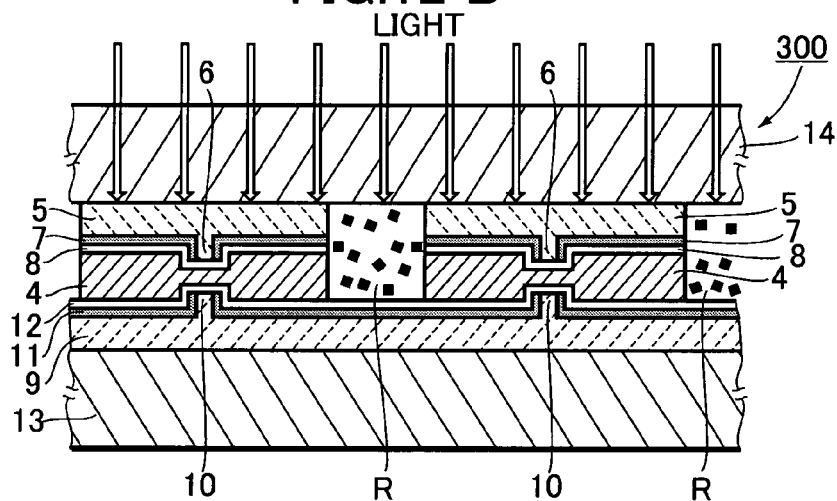
Figure 12:
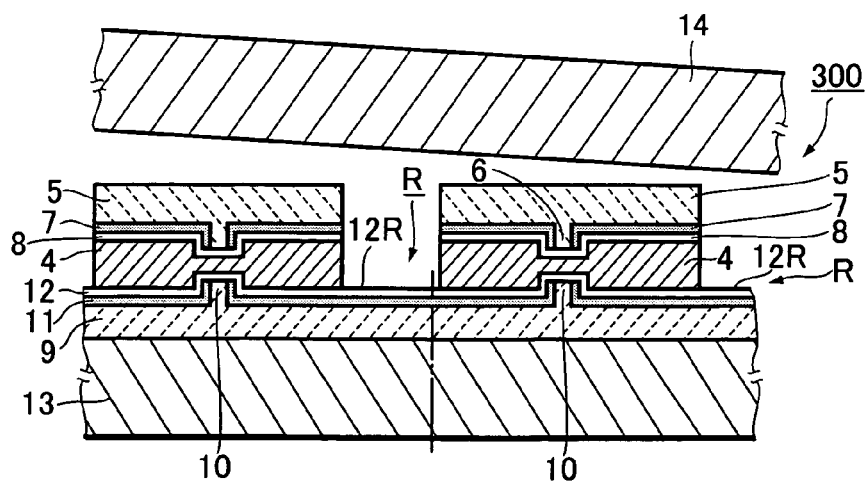

FIG. 10A is a perspective view showing the external structure of a semiconductor laser device according to the present embodiment. FIG. 10B is a diagram showing the cross-sectional structure of the semiconductor laser device shown in FIG. 10A. FIGS. 11A to 12C are diagrams showing the steps for manufacturing this semiconductor laser device. Incidentally, in FIGS. 10A to 12C, the parts identical or equivalent to those of FIGS. 1A to 3B are designated by the same reference numerals.

In FIGS. 10A and 10B, this semiconductor laser device 1 has a hybrid structure as in the first embodiment. That is, a first light-emitting element 2 having a laser part 5 for emitting a blue or ultraviolet (short-wavelength) laser beam and a second light-emitting element 3 having a laser part 9 for emitting a laser beam of longer wavelength (for example, in a 600- to 700-nm waveband) are integrally bonded by an adhesive metal layer 4.

The laser part 5 is made of group-III nitride compound semiconductors containing at least one of aluminum (Al), gallium (Ga), and indium (In), and nitrogen (N). The laser part 5 comprises a double-hetero (DH) structure including an active layer of multiple quantum well structure and two clad layers formed with the active layer interposed therebetween, along with a ridge waveguide 6 formed on a side facing toward the adhesive metal layer 4.

To be more specific, the laser part 5 has the same multilayer structure as that of the laser part 5 shown in FIG. 5, for example. In the multilayer structure, a buffer layer 5a, a bottom layer 5b, an n-type clad layer 5c, an n-type guide layer 5d, an active layer 5e, an electron barrier layer 5f, a p-type guide layer 5g, a p-type clad layer 5h, and a p-type contact layer 5i are stacked in this order. The p-type contact layer 5i and the p-type clad layer 5h are partially removed by etching or the like, so that the ridge waveguide 6 is formed.

The laser part 5 is bonded to the adhesive metal layer 4 via an insulating layer 7 and an ohmic electrode layer 8. An ohmic electrode P1 is formed on the surface of the laser part 5.

The laser part 9 is made of group III–V compound semiconductors containing at least one of aluminum (Al), gallium (Ga), and indium (In), and at least one of arsenic (As), phosphorus (P), and antimony (Sb). The laser part 9 comprises a double-hetero (DH) structure including an active layer of strained quantum well structure and two clad layers formed with the active layer interposed therebetween, along with a ridge waveguide 10 formed on a side facing toward the adhesive metal layer 4.

Specifically, the laser part 9 has the same multilayer structure as that of the laser part 9 shown in FIG. 5, for example. In the multilayer structure, a buffer layer 9a, an n-type clad layer 9b, an active layer 9c, a p-type clad layer 9d, an smoothing layer 9e, and a p-type contact layer 9f are stacked on an n-type GaAs substrate 13 in this order.

The p-type contact layer 9f, the smoothing layer 9e, and the p-type clad layer 9d are partially removed by etching or the like, so that the ridge waveguide 10 mentioned above is formed.

Note that while the laser part 9 shown in FIG. 5 is formed on part of the n-type GaAs substrate 13, the laser part 9 of the present embodiment is formed over the entire surface of the n-type GaAs substrate 13 as shown in FIGS. 10A and 10B. The laser part 9 is bonded to the adhesive metal layer 4 via an insulating layer 11 and an ohmic electrode layer 12 which are formed on the side of the ridge waveguide 10.

As shown in FIGS. 10A and 10B, the second light-emitting element 3 is greater than the first light-emitting element 2 in width, and the ohmic electrode layer 12 extends outside the adhesive metal layer 4 accordingly. An ohmic electrode P3 is formed on the exposed portion 12R. An ohmic electrode P2 is formed on the bottom of the n-type GaAs substrate 13.

When a drive current is supplied through the ohmic electrodes P1 and P3, the drive current flows through the ohmic electrode layer 12 and the adhesive metal layer 4. Meanwhile, the current confined by the ridge waveguide 6 flows into the active layer in the laser part 5 to cause light. By the action of the laser resonator constituted by the cleavages (mirror faces) formed on both ends of the ridge waveguide 6, the laser beam of short wavelength mentioned above is emitted from the cleavages.

When a drive current is supplied through the ohmic electrodes P2 and P3, the drive current flows through the ohmic electrode layer 12. Meanwhile, the current confined by the ridge waveguide 10 flows into the active layer in the laser part 9 to cause light. By the action of the laser resonator constituted by the cleavages (mirror faces) formed on both ends of the ridge waveguide 10, the laser beam of long wavelength mentioned above is emitted from the cleavages.

Incidentally, the first and second light-emitting elements 2 and 3 are given high reflection coating at either one of the cleavages each.

Now, the steps for manufacturing the semiconductor laser device 1 having such a structure will be described with reference to FIGS. 11A to 12C.

Initially, an intermediate 100 for forming a plurality of first light-emitting elements 2 is fabricated in advance as shown in FIG. 11A. An intermediate 200 for forming a plurality of second light-emitting element 3 is fabricated in advance as shown in FIG. 11B.

More specifically, in FIG. 11A, a plurality of semiconductor thin films made of GaN-based semiconductors are stacked, for example, on a sapphire substrate 14 by MOCVD or the like. This forms the double-hetero (DH) structure including the active layer of multiple quantum well structure and the clad layers mentioned above. The top of the clad layer formed above the active layer is etched or otherwise processed selectively so that a plurality of ridge waveguides 6 are formed in parallel at a predetermined pitch.

An insulating layer 7 is formed over the entire top surface except the ridge waveguides 6. Then, an ohmic electrode layer 8 made of, for example, any one of Pd, Pt, and Au, or an alloy of their combination is formed over the entire surface including the ridge waveguides 6 and the insulating layer 7 by such means as evaporation. An adhesive metal layer 4a made of Au is further formed on the ohmic electrode layer 8.

Through these manufacturing steps, the intermediate 100 capable of forming a plurality of first light-emitting elements 2 is fabricated.

Next, in FIG. 11B, a plurality of semiconductor thin films made of AlGaInP-based semiconductors are stacked, for example, on an n-type GaAs substrate 13 by MOCVD or the like. This forms the double-hetero (DH) structure having the active layer of strained quantum well structure and the clad layers mentioned above. Then, the portions above the active layer are etched or otherwise processed selectively so that a plurality of ridge waveguides 10 are formed in parallel at the same pitch as that of the ridge waveguides 6.

An insulating layer 11 is formed over the entire top surface except the ridge waveguides 10. Then, an ohmic electrode layer 12 made of any one of Ti, Pt, Cr, Au, and Au—Zn, or an alloy of their combination is formed over the entire surface including the ridge waveguides 10 and the insulating layer 11 by such means as evaporation. In addition, an adhesive metal layer 4b made of Sn or the like is formed as patterned to regions of predetermined width which include the respective ridge waveguides 10.

Through these manufacturing steps, the intermediate 200 capable of forming a plurality of second light-emitting elements 3 is fabricated.

After the intermediates 100 and 200 are thus fabricated in advance, the adhesive metal layers 4a and 4b are brought into contact to couple the intermediates 100 and 200 as shown in FIG. 12A.

Here, the intermediates 100 and 200 are coupled in advance so that when the individual semiconductor laser devices 1 are separated by such means as cleaving to be described later, the emitting spots of the laser beams from the laser parts 5 and 9 in each of the semiconductor laser devices 1 lie close to each other.

Then, the intermediates 100 and 200 are pressed against each other under the application of a predetermined force, in which state the entire articles are heated to fuse the adhesive metal layers 4a and 4b, followed by heat removal. Consequently, the adhesive metal layers 4a and 4b are integrated into the adhesive metal layer 4, and the intermediates 100 and 200 are bonded into an integral intermediate 300.

Next, in FIG. 12B, the junction between the sapphire substrate 14 and the laser part 5 is irradiated with light which is transmitted through the sapphire substrate 14 and absorbed by group-III nitride compound semiconductors. As a result, the vicinity of the junction between the laser part 5 and the sapphire substrate 14 is heated. The heat decomposes the semiconductor thin film near the junction to weaken the joining force between the sapphire substrate 14 and the laser part 5 for easier removal.

There are air gaps R at the regions where the adhesive metal layer 4 is not formed. Then, the ohmic electrode layer 8, the insulating layer 7, and the laser part 5 facing the gaps R partially collapse into the gaps R because of gas which occurs from the decomposition of the semiconductor thin film. Consequently, the laser part 5 is separated into a plurality of laser parts 5 across the gaps R.

Next, as shown in FIG. 12C, the sapphire substrate 14 is removed from the intermediate 300. By means of the removal process as mentioned above, the individual laser parts 5 separated across the gaps R are transferred to the laser part 9, and the removal sides of the respective laser parts 5 are exposed. Part of the ohmic electrode layer 12 is also exposed by the gaps R.

Next, the intermediate 300 from which the sapphire substrate 14 is removed is ultrasonic cleaned in pure water, for example. This eliminates the collapsed pieces and the like of the laser parts 5. Subsequently, the intermediate 300 is immersed in dilute hydrochloric acid for about three minutes to eliminate residual gallium metal on the laser parts 5 and the exposed surfaces of the ohmic electrode layer 12, and to clean the immediate 300 all over.

After the cleaning, ohmic electrodes P1 made of such materials as any one of Ti, Al, and Au, or an alloy of their combination are formed on the exposed surfaces of the laser parts 5 by such means as evaporation. An ohmic electrode P2 made of such material as any one of Ni, Au, and Au—Ge, or an alloy thereof is formed on the bottom of the n-type GaAs substrate 13 by such means as evaporation. Ohmic electrodes P3 made of Au or the like are also formed on the exposed portions 12R of the ohmic electrode layer 12 by such means as evaporation.

After the formation of the ohmic electrode layers P1, P2, and P3, the intermediate 300 is cleaved at predetermined intervals in the direction perpendicular to the ridge waveguides 6 and 10.

For example, the cleaving is performed along the (1-100) planes, or the cleavages of the laser parts 5 which are provided with the multilayer structure of the GaN-based thin films. High reflection coating such as a dielectric thin film is formed on either one of the cleavages to form laser resonators. That is, the cleaving is performed as is shown in FIG. 4B.

Next, the laser part 9 and the n-type GaAs substrate 13 are scribed for separation along predetermined points corresponding to the respective gaps R, such as the point shown by the double-dotted line in FIG. 12C. As a result, each individual semiconductor laser device 1 shown in FIGS. 10A and 10B is completed.

As above, according to the semiconductor laser device 1 of the present embodiment, the laser parts 5 and 9 are bonded by the interposition of the adhesive metal layer 4 which can be formed in a reduced thickness as shown in FIGS. 10A and 10B. This structure allows a reduction in the distance between the light-emitting spots. Then, when it is used as a light source of an optical pickup for data recording or data reproduction on CDs, DVDs, and other storage media, the semiconductor laser device 1 provides such effects as a significant reduction of the occurrence of aberrations.

In the first embodiment, the laser part 9 is etched or otherwise formed into a concave shape so that the adhesive metal layer 4 becomes uneven in section as shown in FIGS. 1A and 1B. In contrast, the semiconductor laser device 1 of this second embodiment has the laser part 9 of so-called flat shape as shown in FIGS. 10A and 10B. This allows further simplification of the manufacturing steps.

Besides, part of the ohmic electrode layer 12 is extended outside the laser parts 5 and 9 to form the exposed portion 12R. This facilitates providing a contact for supplying the drive currents. The ohmic electrode layer 12 functions as a so-called common electrode for supplying the drive currents to the laser parts 5 and 9. It is therefore possible to reduce the number of electrodes for supplying the drive currents.

According to the manufacturing method of the present embodiment, the intermediates 100 and 200 are bonded by the adhesive metal layer 4 to fabricate an integral intermediate 300 before the intermediate 300 is separated into the individual semiconductor laser devices 1 by cleaving, scribing, etc. The distance between the light-emitting spots in each of the semiconductor laser devices 1 to be separated later can thus be controlled and optimized at a time for a plurality of pair of first and second light-emitting elements 2 and 3 in bonding the intermediates 100 and 200 by the adhesive metal layer 4 during the semiconductor manufacturing steps. The light-emitting spots can also be aligned with high precision. Since the distances between the light-emitting spots can be controlled and optimized at a time, it is possible to provide such effects as improved mass-producibility and uniform quality.

THIRD EXAMPLE

Figure 13:
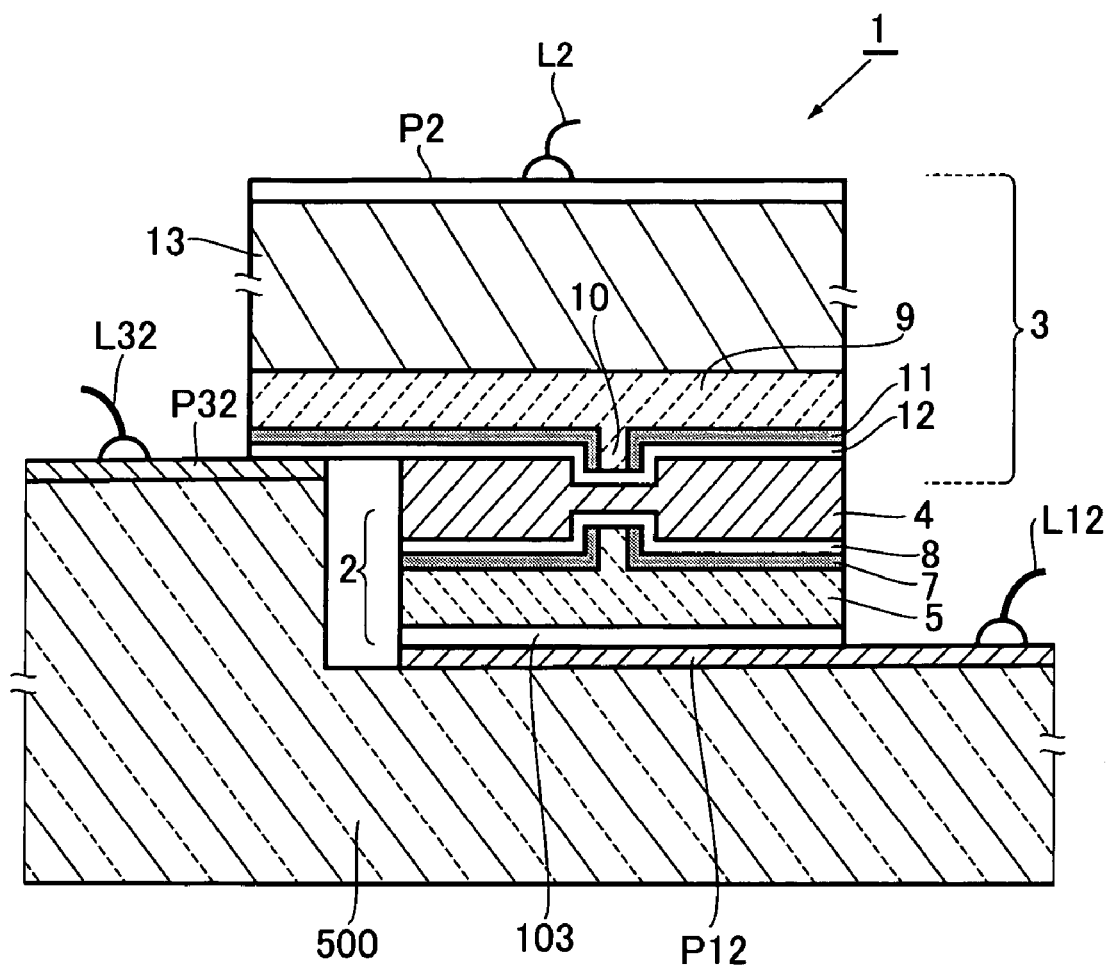
FIG. 13 is a sectional view showing the structure of the semiconductor laser device according to a third example.

Next, an example of the second embodiment will be described with reference to FIG. 13. FIG. 13 is a cross-sectional view showing the structure of the semiconductor laser device of this example, in which the parts identical or equivalent to those of FIGS. 10A and 10B are designated by the same reference numerals.

In FIG. 13, this semiconductor laser device has the structure that the semiconductor laser device 1 shown in FIGS. 10A and 10B is bonded to an electrically-insulative support substrate (submount) 500 of ceramic or the like having high thermal conductivity.

The support substrate 500 has a first face on which an adhesive metal layer P12 is formed, and a second face on which an adhesive metal layer P32 is formed. The support substrate 500 has the stepped shape that the first face is located below the second face.

The difference in height between the first and second faces is rendered almost the same as the difference in height between the exposed surface of the laser part 5, which is created by the removal of the sapphire substrate 14 described in conjunction with FIG. 12C, and the exposed surface of the ohmic electrode layer 12. The adhesive metal layers P12 and P32 are formed by laminating metal having high electric and thermal conductivities on the first and second faces, respectively, by such means as evaporation.

The exposed surface of the laser part 5 and the adhesive metal layer P12 are electrically bonded to each other through an ohmic electrode layer 103 made of Au or the like. The exposed surface of the ohmic electrode layer 12 and the adhesive metal layer P32 are electrically bonded to each other. Leads L12 and L32 for supplying a drive current are connected to the adhesive metal layers P12 and P32, respectively.

When a drive current is supplied through the leads L12 and L32, the current confined by the ridge waveguide 6 flows into the active layer in the laser part 5 to cause light. As a result, the first light-emitting element 2 emits a blue or ultraviolet laser beam of so-called short wavelength (for example, in a 400-nm waveband).

Moreover, a lead L2 is connected to the ohmic electrode P2 on the GaAs substrate 13. When a drive current is supplied through the leads L32 and L2, the current confined by the ridge waveguide 10 flows into the active layer in the laser part 9 to cause light. As a result, the second light-emitting element 3 emits a red (for example, 600- to 700-nm-band) laser beam.

As above, according to the semiconductor laser device of this example, the laser parts 5 and 9 of the first and second light-emitting elements 2 and 3 are bonded to the support substrate 500 of stepped shape, i.e., which has a step. Heat which occurs in the laser parts 5 and 9 during light emission can thus be dissipated with high efficiency.

In particular, since the laser part 9, an AlGaInP-based laser of low thermal conduction, is located away from the support substrate 500, the heat occurring in the laser part 9 must be dissipated with high efficiency. Two heat dissipation paths, or a first heat dissipation path for dissipating heat through the exposed portion 12R of the ohmic electrode layer 12 to the support substrate 500 and a second heat dissipation path for dissipating heat through the adhesive metal layer 4 and the laser part 5 to the support substrate 500 allow efficient dissipation of the heat which occurs in the laser part 9.

Furthermore, as is described in the second embodiment, the laser parts 5 and 9 are bonded by the interposition of the adhesive metal layer 4 which has a small thickness. This structure allows a reduction in the distance between the light-emitting spots of the laser parts 5 and 9. It is therefore possible to provide a semiconductor laser device which is suitably applicable to an optical pickup for data recording or data reproduction on storage media such as CDs and DVDs.

[Third Embodiment]

Now, a third embodiment of the present invention will be described with reference to FIGS. 14A to 17.

Figure 17:
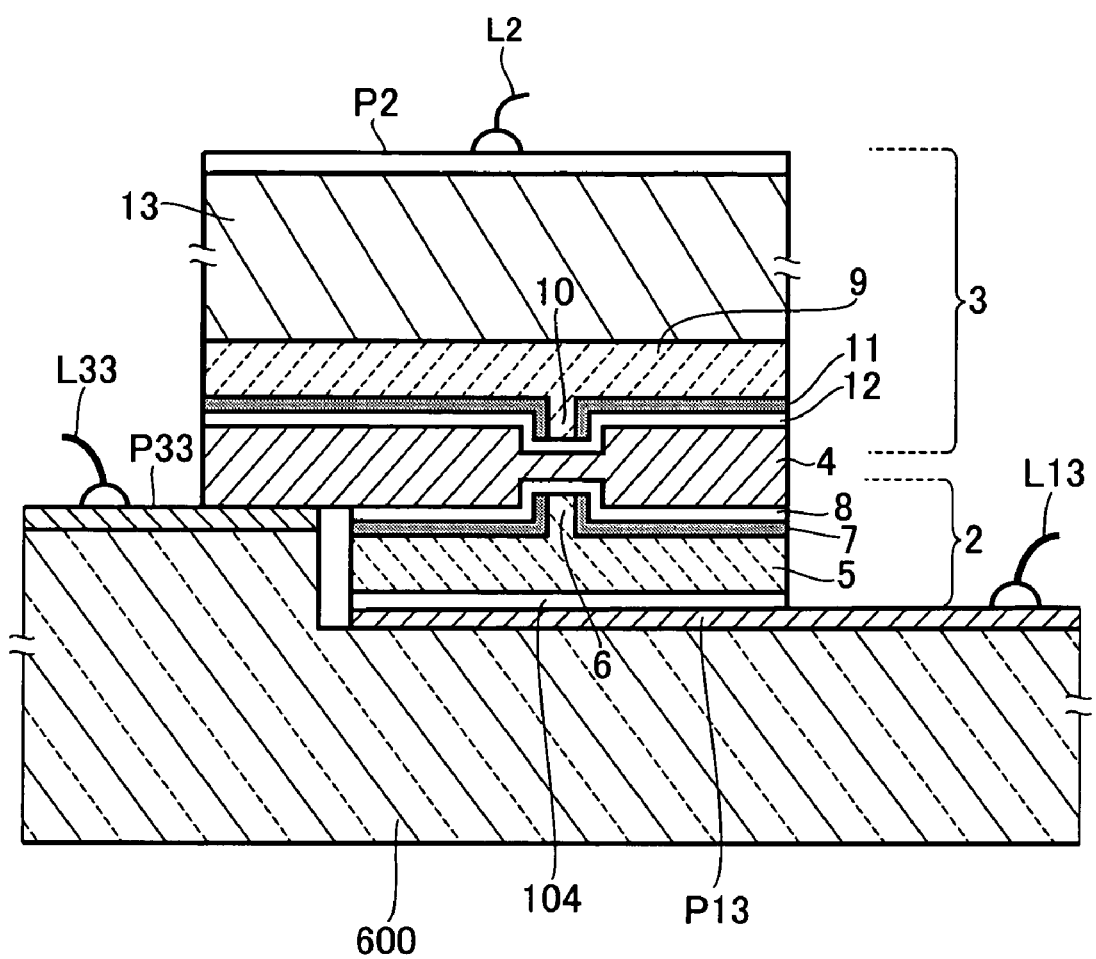
FIG. 17 is a sectional view showing the structure of a more concrete example of the semiconductor laser device according to the third embodiment.

FIG. 14A is a perspective view showing the external structure of a semiconductor laser device according to the present embodiment. FIG. 14B is a diagram showing the sectional structure of the semiconductor laser device shown in FIG. 14A. FIGS. 15A to 16C are diagrams showing the steps for manufacturing the semiconductor laser device. FIG. 17 is a sectional view showing a modified mode of the present embodiment.

Incidentally, in FIGS. 14A to 17, the parts identical or equivalent to those of FIGS. 1A to 3B are designated by the same reference numerals.

In FIGS. 14A and 14B, this semiconductor laser device 1 has a hybrid structure as in the first embodiment. That is, a first light-emitting element 2 having a laser part 5 for emitting a laser beam of short wavelength (for example, in a 400-nm waveband) and a second light-emitting element 3 having a laser part 9 for emitting a laser beam of longer wavelength (for example, in a 600- to 700-nm waveband) are integrally bonded to each other by an adhesive metal layer 4.

The laser part 5 comprises a double-hetero (DH) structure including an active layer of multiple quantum well structure and two clad layers formed with the active layer interposed therebetween, and a ridge waveguide 6 which is formed on the side facing toward the adhesive metal layer 4. The active layer is made of a group-III nitride compound semiconductor containing at least one of aluminum (Al), gallium (Ga), and indium (In), and nitrogen (N).

To be more specific, the laser part 5 has the same multilayer structure as that of the laser part 5 shown in FIG. 5, for example. In the multilayer structure, a buffer layer 5a, a bottom layer 5b, an n-type clad layer 5c, an n-type guide layer 5d, an active layer 5e, an electron barrier layer 5f, a p-type guide layer 5g, a p-type clad layer 5h, and a p-type contact layer 5i are stacked in this order. The p-type contact layer 5i and the p-type clad layer 5h are partially removed by etching or the like, so that the ridge waveguide 6 is formed.

The laser part 5 is bonded to the adhesive metal layer 4 via an insulating layer 7 and an ohmic electrode layer 8. An ohmic electrode P1 is formed on the surface of the laser part 5.

The laser part 9 comprises a double-hetero (DH) structure including an active layer of strained quantum well structure and two clad layers formed with the active layer interposed therebetween, and a ridge waveguide 10 which is formed on the side facing toward the adhesive metal layer 4. The active layer is made of a group III–V compound semiconductor containing at least one of aluminum (Al), gallium (Ga), and indium (In), and at least one of arsenic (As), phosphorus (P), and antimony (Sb).

Specifically, the laser part 9 has the same multilayer structure as that of the laser part 9 shown in FIG. 5, for example. In the multilayer structure, a buffer layer 9a, an n-type clad layer 9b, an active layer 9c, a p-type clad layer 9d, a smoothing layer 9e, and a p-type contact layer 9f are stacked on the substrate 13 in this order. The p-type contact layer 9f, the smoothing layer 9e, and the p-type clad layer 9d are partially removed by etching or the like, so that the ridge waveguide 10 mentioned above is formed.

The laser part 9 is bonded to the adhesive metal layer 4 via an insulating layer 11 and an ohmic electrode layer 12. An ohmic electrode P2 is formed on the bottom of n-type GaAs substrate 13.

The semiconductor laser device 1 of the present embodiment is structurally different from the semiconductor laser device 1 of the first embodiment in the following respect.

In the semiconductor laser device 1 of the first embodiment, as shown in FIGS. 1A and 1B, the laser part 9 is formed on part of the substrate 13. Besides, the adhesive metal layer 4 is formed over the laser part 9 and the region of the substrate 13 where the laser part 9 is not formed. This makes the adhesive metal layer 4 uneven in section.

The concave portion of the adhesive metal layer 4 is extended and exposed outside the laser part 5 and 9, thereby forming the exposed portion 4R.

In contrast, as shown in FIGS. 14A and 14B, the semiconductor laser device 1 of the present embodiment has the laser part 9 formed over the entire substrate 13. The adhesive metal layer 4 is formed over the entire surface of the laser part 9.

Then, the portion of the adhesive metal layer 4 extended to protrude outside the laser part 5 forms the exposed portion 4R.

As above, the semiconductor laser device 1 of the present embodiment has a structure different from that of the semiconductor laser device 1 of the first embodiment.

When a drive current is supplied through the ohmic electrodes P1 and P3, the drive current flows through the ohmic electrode layer 8 and the adhesive metal layer 4. Meanwhile, the current confined by the ridge waveguide 6 flows into the active layer in the laser part 5 to cause light. By the action of the laser resonator constituted by the cleavages (mirror faces) formed on both ends of the ridge waveguide 6, the laser beam of short wavelength mentioned above is emitted from the cleavages.

When a drive current is supplied through the ohmic electrodes P2 and P3, the drive current flows through the ohmic electrode layer 12 and the adhesive metal layer 4. Meanwhile, the current confined by the ridge waveguide 10 flows into the active layer in the laser part 9 to cause light. By the action of the laser resonator constituted by the cleavages (mirror faces) formed on both ends of the ridge waveguide 10, the laser beam of long wavelength mentioned above is emitted from the cleavages.

Incidentally, the first and second light-emitting elements 2 and 3 shown in FIGS. 14A and 14B are given high reflection coating at either one of the end cleavages each.

Now, the steps for manufacturing the semiconductor laser device 1 having such a structure will be described with reference to FIGS. 15A to 16C.

Initially, an intermediate 100 for forming a plurality of first light-emitting elements 2 is fabricated in advance as shown in FIG. 15A. An intermediate 200 for forming a plurality of second light-emitting element 3 is fabricated in advance as shown in FIG. 15B.

More specifically, in FIG. 15A, a plurality of semiconductor thin films made of GaN-based semiconductors are stacked, for example, on a sapphire substrate 14 by MOCVD or the like. This forms the double-hetero (DH) structure having the active layer of multiple quantum well structure and the clad layers. The portions above the active layer are etched or otherwise processed selectively so that a plurality of ridge waveguides 6 are formed in parallel at a predetermined pitch.

An insulating layer 7 is formed over the entire top surface except the ridge waveguides 6. Then, an ohmic electrode layer 8 made of, for example, any one of Pd, Pt, and Au, or an alloy of their combination, and an adhesive metal layer 4a made of Au are formed in succession by such means as evaporation. Here, the ohmic electrode layer 8 and the adhesive metal layer 4a are formed as patterned to regions of predetermined width (corresponding to the width of the laser part 5) which include the respective ridge waveguides 6.

Through these fabrication steps, the intermediate 100 capable of forming a plurality of first light-emitting elements 2 is fabricated. In the intermediate 100, the insulating layer 7 is exposed at regions where neither of the ohmic electrode layer 8 and the adhesive metal layer 4a is formed.

Next, in FIG. 14B, a plurality of semiconductor thin films made of AlGaInP-based semiconductors are stacked, for example, on an n-type GaAs substrate 13 by MOCVD or the like. This forms the double-hetero (DH) structure having the active layer of strained quantum well structure and the clad layers. Then, the clad layer above the active layer is etched or otherwise processed selectively so that a plurality of ridge waveguides 10 are formed in parallel at the same pitch as that of the ridge waveguides 6.

An insulating layer 11 is formed over the entire top surface except the ridge waveguides 10. Then, an ohmic electrode layer 12 made of any one of Ti, Pt, Cr, Au, and Au—Zn, or an alloy of their combination, and an adhesive metal layer 4b made of Sn or the like are formed in succession on the entire surface including the ridge waveguides 10 and the insulating layer 11 by such means as evaporation.

Through these manufacturing steps, the intermediate 200 capable of forming a plurality of second light-emitting elements 3 is fabricated.

After the intermediates 100 and 200 are thus fabricated in advance, the adhesive metal layers 4a and 4b are brought into contact to couple the intermediates 100 and 200 as shown in FIG. 16A.

Here, the intermediates 100 and 200 are coupled in advance so that when the individual semiconductor laser devices 1 are separated by such means as cleaving to be described later, the emitting spots of the laser beams on the laser parts 5 and 9 in each of the semiconductor laser devices 1 lie close to each other.

Then, the intermediates 100 and 200 are pressed against each other under the application of a predetermined force, in which state the entire articles are heated to fuse the adhesive metal layers 4a and 4b, followed by heat removal.

Consequently, the adhesive metal layers 4a and 4b are integrated into the adhesive metal layer 4, excluding the regions where the insulating layer 7 is exposed. The intermediates 100 and 200 are bonded into an integral intermediate 300.

More specifically, as shown in FIG. 15B, the intermediate 200 has the adhesive metal layer 4b which is formed almost all over. In contrast, as shown in FIG. 15A, the intermediate area 100 is provided with the regions where the adhesive metal layer 4a is formed and the regions where the insulating layer 7 is exposed.

Consequently, as shown in FIG. 16A, when the adhesive metal layers 4a and 4b are pressed against each other and heated together, followed by heat removal, there arises an integrated adhesive metal layer 4 in which the insulating layer 7 and the regions of the adhesive metal layer 4b opposed thereto are not bonded to each other.

Next, in FIG. 16B, the junction between the sapphire substrate 14 and the laser part 5 is irradiated with light which is transmitted through the sapphire substrate 14 and absorbed by group-III nitride compound semiconductors. As a result, the vicinity of the junction between the laser part 5 and the sapphire substrate 14 is heated. The heat decomposes this portion to weaken the joining force between the sapphire substrate 14 and the laser part 5 for easier removal.

Next, as shown in FIG. 16C, the sapphire substrate 14 is removed from the intermediate 300.

By means of the removal process as mentioned above, the laser part 5 is transferred to the laser part 9 except the regions where the insulating layer 7 has been exposed. Consequently, the laser parts 5 are separated across the regions where the insulating layer 7 has been exposed. The adhesive metal layer 4 is also exposed at regions which have been opposed to the exposed portions of the insulating layer 7.

Next, the intermediate 300 from which the sapphire substrate 14 is removed is ultrasonic cleaned in pure water, for example. This eliminates the collapsed pieces of the laser parts 5 remaining on the exposed portions 4R of the adhesive metal layer 4. Subsequently, the intermediate 300 is immersed in dilute hydrochloric acid for about three minutes to eliminate residual gallium metal on the exposed surfaces of the laser parts 5, and to clean the immediate 300 all over.

After the cleaning described above, ohmic electrodes P1 made of any one of Ti, Al, and Au, or an alloy of their combination are formed on the exposed tops of the respective laser parts 5 by such means as evaporation. An ohmic electrode P2 made of Ni, Au, Au—Ge, or an alloy of their combination is formed on the bottom of the n-type GaAs substrate 13 by such means as evaporation. Ohmic electrodes P3 are also formed on the exposed portions of the adhesive metal layer 4 by such means as evaporation.

After the formation of the ohmic electrode layers P1, P2, and P3, the intermediates 300 is cleaved at predetermined intervals along the direction perpendicular to the ridge waveguides 6 and 10.

For example, the cleaving is performed along the (1-100) planes, or the cleavages of the laser parts 5 which are provided with the multilayer structure of the GaN-based thin films. High reflection coating such as a dielectric thin film is formed on either one of the cleavages to form laser resonators. That is, the cleaving is performed as is shown in FIG. 4B.

Next, the laser part 9 and the n-type GaAs substrate 13 are scribed for separation along the exposed portions of the adhesive metal layer 4, such as the point shown by the double-dotted line in FIG. 16C. As a result, each individual semiconductor laser device as shown in FIGS. 14A and 14B is completed.

As above, according to the semiconductor laser device 1 of the third embodiment, the adhesive metal layer 4 capable of reduction in thickness can be interposed to reduce the distance between the light-emitting spots of the laser part 5 of the first light-emitting element 2 and the laser part 9 of the second light-emitting element 3. Then, when it is used as a light source of an optical pickup for data recording or data reproduction on CDs, DVDs, and other storage media, the semiconductor laser device 1 provides such effects as a significant reduction of the occurrence of aberrations.

Moreover, the manufacturing method of the present embodiment does not require the manufacturing step by which the laser part 9 is etched or otherwise processed to form the adhesive metal layer 4 of uneven section so that the adhesive metal layer 4 is exposed, as in the first embodiment shown in FIGS. 1A and 1B. It is therefore possible to provide a simpler manufacturing method.

FIG. 17 shows the structure of a semiconductor laser device in which the semiconductor laser device 1 according to the present embodiment shown in FIGS. 14A and 14B is bonded to an electrically-insulative substrate (submount) 600 of ceramic or the like having high thermal conductivity for the sake of an improved heat dissipation effect.

More specifically, the support substrate 600 has a first face on which an adhesive metal layer P13 is formed and a second face on which an adhesive metal layer P33 is formed. The support substrate 600 has the stepped shape that the first face is located below the second face by a predetermined height.

An ohmic electrode layer 104 made of any one of Ti, Al, and Au, or an alloy of their combination is formed on the exposed surface of the laser part 5 which is created by the removal of the sapphire substrate 14.

Then, the semiconductor laser device 1 is bonded to the support substrate 600 by fusing the ohmic electrode layer 104 and the adhesive metal layer P13 each other and fusing the adhesive metal layer 4 and the adhesive metal layer P33 each other.

When a drive current is supplied through leads L12 and L32 which are connected to the adhesive metal layers P13 and P33, respectively, the current confined by the ridge waveguide 6 flows into the active layer in the laser part 5 to cause light. As a result, the first light-emitting element 2 emits a blue or ultraviolet laser beam of so-called short wavelength.

Moreover, a lead L2 is connected to the ohmic electrode P2 on the substrate 13. When a drive current is supplied through the leads L32 and L2, the current confined by the ridge waveguide 10 flows into the active layer in the laser part 9 to cause light. As a result, the second light-emitting element 3 emits a red (for example, 600- to 700-nm-band) laser beam.

[Fourth Embodiment]

Figure 18:
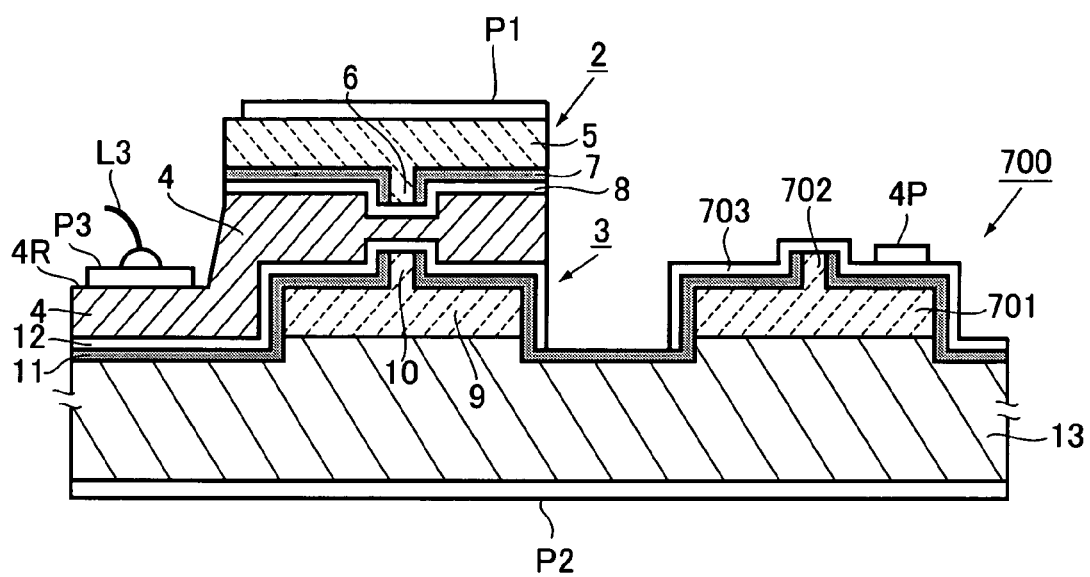
FIG. 18 is a sectional view showing the structure of the semiconductor laser device according to a fourth embodiment.

Next, the semiconductor laser device according to a fourth embodiment of the present invention will be described with reference to FIG. 18. FIG. 18 is a longitudinal sectional view showing the structure of the semiconductor laser device according to the present invention, in which the parts identical or equivalent to those of FIGS. 1A and 1B are designated by the same reference numerals.

In FIG. 18, this semiconductor laser device comprises a first light-emitting element 2, a second light-emitting element 3, and an additional third light-emitting element 700. The first light-emitting element 2 has the laser part 5 shown in FIGS. 1A and 1B, and the second light-emitting element 3 the laser part 9. The third light-emitting element 700 has a laser part 701. The laser parts 5, 9, and 701 emit respective laser beams of different wavelengths.

The laser part 5 is made of a GaN-based laser, having the multilayer structure in which the GaN-based thin films $5a$ to $5i$ described with reference to FIG. 5 are stacked, for example.

An insulating layer 7 is formed on a side of the laser part 5 where the ridge waveguide 6 lies. An ohmic electrode layer 8 to be electrically connected with the ridge waveguide 6 is stacked on the insulating layer 7.

The laser parts 9 and 701 are monolithic semiconductor lasers formed on the same GaAs substrate 13. The laser part 9 is made of an AlGaInP-based laser, having the multilayer structure in which the AlGaInP-based thin films 9a to 9f described with reference to FIG. 5 are stacked, for example. The laser part 701 is made of an AlGaAs-based laser.

An insulating layer 11 is stacked over the laser parts 9, 701 and the substrate 13, excluding ridge waveguides 10 and 702 which are formed on the laser parts 9 and 701, respectively. In addition, ohmic electrode layers 12 and 703 to be electrically connected to the ridge waveguides 10 and 702, respectively, are stacked on the insulating layer 11. Note that the ohmic electrode layers 12 and 703 are not in electric connection with each other.

The laser parts 5 and 9 are bonded to each other by an adhesive metal layer 4 which is interposed between the ohmic electrode layer 8 formed on the laser part 5 and the ohmic electrode layer 12 formed on the laser part 9.

Ohmic electrodes P1, P2, P3, and P4 are formed on the surface of the laser part 5, the bottom of the substrate 13, an exposed portion 4R of the adhesive metal layer 4, and an end of the ohmic electrode layer 703, respectively.

When a drive current is supplied through the ohmic electrodes P1 and P3, the drive current flows to the laser part 5 via the adhesive metal layer 4. The current confined by the ridge waveguide 6 flows into the active layer in the laser part 5 for laser oscillation. As a result, a 405-nm-band laser beam is emitted.

When a drive current is supplied through the ohmic electrodes P2 and P3, the drive current flows to the laser part 9 via the adhesive metal layer 4 and the substrate 13. The current confined by the ridge waveguide 10 flows into the active layer in the laser part 9 for laser oscillation. As a result, a 650-nm-band laser beam is emitted.

When a drive current is supplied through the ohmic electrodes P2 and P4, the drive current flows to the laser part 701 via the substrate 13. The current confined by the ridge waveguide 702 flows into the active layer in the laser part 701 for laser oscillation. As a result, a 780-nm-band laser beam is emitted.

The semiconductor laser device of the present embodiment is fabricated in the following way. Here, description will be given with reference to FIGS. 2A to 4C which have been cited to describe the manufacturing method according to the first embodiment.

Initially, as is shown in FIGS. 2A and 2B, an intermediate 100 capable of forming a plurality of first light-emitting elements 2 and an intermediate 200 capable of forming a plurality of second and third light-emitting elements 3, 700 are fabricated in advance.

It should be noted that the intermediate 200 is formed as a monolithic semiconductor device having both laser parts 9 and laser parts 701. The laser parts 9 are formed by stacking AlGaInP-based lasers, and the laser parts 701 by stacking AlGaAs-based lasers, on a substrate 13 by such semiconductor manufacturing processes as MOCVD and etching. Here, the laser parts 9 and 701 are located alternately.

For example, in FIG. 2B, the laser part 9 lying on the right in the diagram is replaced with a laser part 701 so that the laser part 9 lying on the left and the laser part 701 are formed alternately. Grooves as shown in FIG. 2B are formed in the substrate 13 at between the laser parts 9 and 701. Then, an insulating layer 11 is formed all over the laser parts 9, 701 and the grooves except the ridge waveguides 10 and 702.

Then, an ohmic electrode layer 12 and an adhesive metal layer 4b to be electrically connected with the ridge waveguides 10 are evaporated or otherwise formed on the regions where the insulating layer 11 is formed on the laser parts 9 and the grooves. Moreover, an ohmic electrode layer 703 to be electrically connected with the ridge waveguides 702 is evaporated or otherwise formed on the regions where the insulating layer 11 is formed on the laser parts 701, so as not to make electric connection with the ohmic electrode layer 12.

Through these manufacturing steps, the intermediate 200 is prefabricated in which the insulating layer 11, the ohmic electrode layer 12, and the adhesive metal layer 4b are formed on the laser parts 9, and the insulating layer 11 and the ohmic electrode layer 703 are formed on the laser parts 701 without the adhesive metal layer 4b. Since the laser parts 9 are formed to protrude from the grooves, the adhesive metal layer 4b becomes uneven in section due to the step between the laser parts 9 and the grooves.

Meanwhile, the intermediates 100 is formed as is shown in FIG. 2A. That is, a laser part 5 having ridge waveguides 6 is formed on a sapphire substrate 14. Note that the formed ridge waveguides 6 correspond to the laser parts 9 of the intermediate 200 alone, not the laser parts 701.

For example, in FIG. 2A, the ridge waveguide 6 lying on the left in the diagram is formed while the one on the right is not.

An insulating layer 7 is formed over the entire surface of the laser part 5 except the ridge waveguides 6. Then, an ohmic electrode layer 8 and an adhesive metal layer 4a to be electrically connected with the ridge waveguides 6 are stacked in succession.

After the intermediates 100 and 200 are thus fabricated in advance, the intermediates 100 and 200 are coupled as is shown in FIG. 2C, i.e., by bringing the adhesive metal layer 4b formed on the intermediate 200 and the adhesive metal layer 4a formed on the intermediate layer 100 into contact so that the laser parts 9 and the laser part 5 are opposed to each other.

Then, the intermediates 100 and 200 are pressed against each other under the application of a predetermined force, in which state they are heated and cooled so that the adhesive metal layers 4a and 4b are fused into an integral adhesive metal layer 4. As a result, the laser parts 9 and the laser part 5 are bonded to each other by the interposition of the adhesive metal layer 4.

Incidentally, FIG. 2C shows the state where the two laser parts 5 and the two laser parts 9 are bonded to each other by the adhesive meta layer 4. When the intermediates 100 and 200 of the present embodiment are coupled and bonded, however, a gap arises over the laser part 9 lying on the right in FIG. 2C, which is actually a laser part 701, since no adhesive metal layer 4b is formed on the laser part 701.

Next, as is shown in FIG. 3A, the backside of the sapphire substrate 14 is irradiated with light which is transmitted through the sapphire substrate 14 and absorbed by group-III nitride compound semiconductors. As a result, the vicinity of the junction between the laser part 5 and the sapphire substrate 14 is heated. The heat decomposes this portion to weaken the joining force between the sapphire substrate 14 and the laser part 5 for easier removal.

In addition, there is the gap over the laser part 9 which lies on the right in FIG. 3A since this part is a laser part 701 and no adhesive metal layer 4b is formed on the laser part 701. Furthermore, the concave section of the adhesive metal layer 4 also creates gaps (the gaps designated by the reference symbol R in FIG. 3A).

Consequently, when heated by the irradiation light, the portions of the laser part 5 facing these gaps are decomposed to collapse.

Next, as is shown in FIG. 3B, the sapphire substrate 14 is removed. This transfers the laser parts 5 to the laser parts 9, and exposes the laser parts 701 and the portions of the adhesive metal layer 4 where it is concave in section.

That is, the intermediate 300 of the present embodiment has such structure that the laser part 9 shown to the right in FIG. 4A is a laser part 701, and the laser part 701 thus has no corresponding adhesive metal layer 4 or laser part 5.

After predetermined cleaning, ohmic electrodes P1, P2, and P3 are formed on the end faces of the laser parts 5 from which the sapphire substrate 14 is removed, the bottom of the substrate 13, and the exposed portions 4R of the adhesive metal layer 4 where it is concave in section, respectively.

Next, as is shown in FIG. 4B, the intermediate 300 is cleaved at predetermined intervals in the direction perpendicular to the ridge waveguides 6, 10, and 702. Cleavages are coated with a predetermine dielectric thin film to constitute laser resonators.

Next, as is shown in FIG. 4C, the intermediate 300 is separated into individual semiconductor laser devices by scribing at predetermined portions.

Here, with adjoining laser parts 9 and 701 as a pair, the scribing is performed on the positions on both sides of these laser parts 9 and 701 (the positions of grooves formed in the substrates 13). This separates each individual semiconductor laser device and forms the ohmic electrodes P1, P2, and P3, thereby completing the semiconductor laser device of the present embodiment shown in FIG. 18.

As above, according to the present embodiment, it is possible to provide a semiconductor laser device for emitting three laser beams of different wavelengths.

According to the semiconductor laser device of the present embodiment, the first laser part 5 is bonded to at least either of the second and third laser parts 9 and 701, which are formed as a monolithic semiconductor device, by the interposition of the adhesive metal layer 4 capable of reduction in thickness. It is therefore possible to reduce the distance between the light-emitting spots of the laser parts 5 and 9.

According to the manufacturing method of the present embodiment, as shown in FIG. 18, the adhesive metal layer 4 for bonding the laser parts 5 and 9 can be formed as partially exposed outside the laser parts 5 and 9. This facilitates forming a contact for supplying drive currents on the exposed portion 4R.

It should be noted that the semiconductor laser device of the prevent embodiment is not limited to the structure shown in FIG. 18. For example, the semiconductor laser device 1 having the structure shown in FIGS. 10A and 10B may be provided with the third light-emitting element 700 described in the present embodiment. The semiconductor laser device 1 having the structure shown in FIGS. 14A and 14B may also be provided with the third light-emitting element 700 described in the present embodiment.

Figure 14:
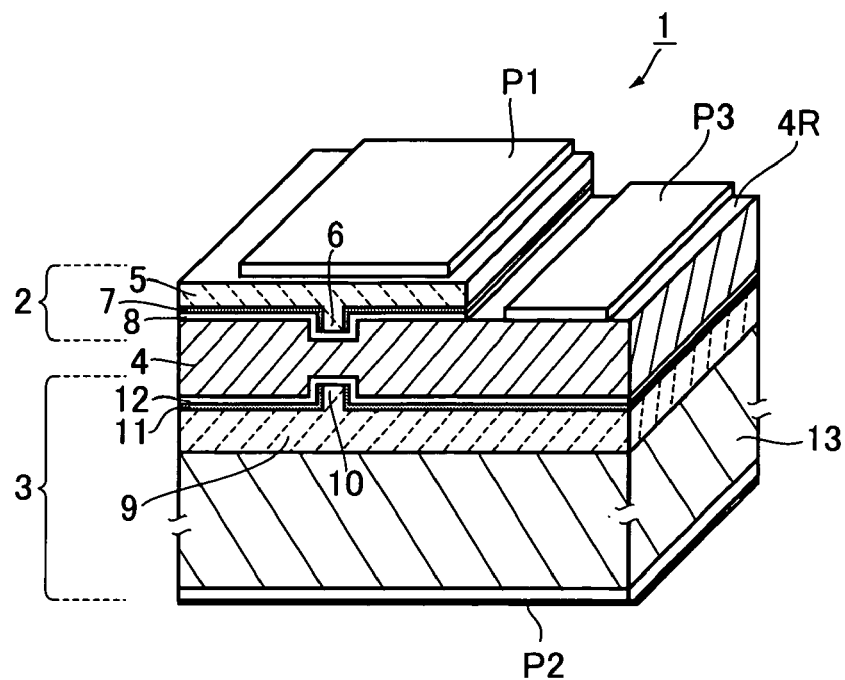
FIGS. 14A and 14B are diagrams showing the external structure and sectional structure of a semiconductor laser device according to a third embodiment.
Figure 14:
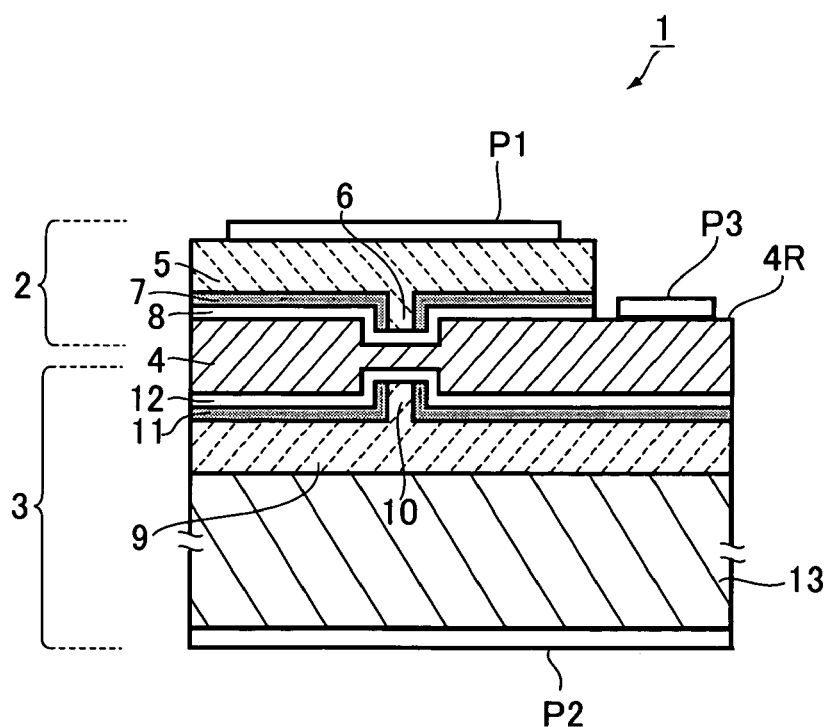
Figure 15:
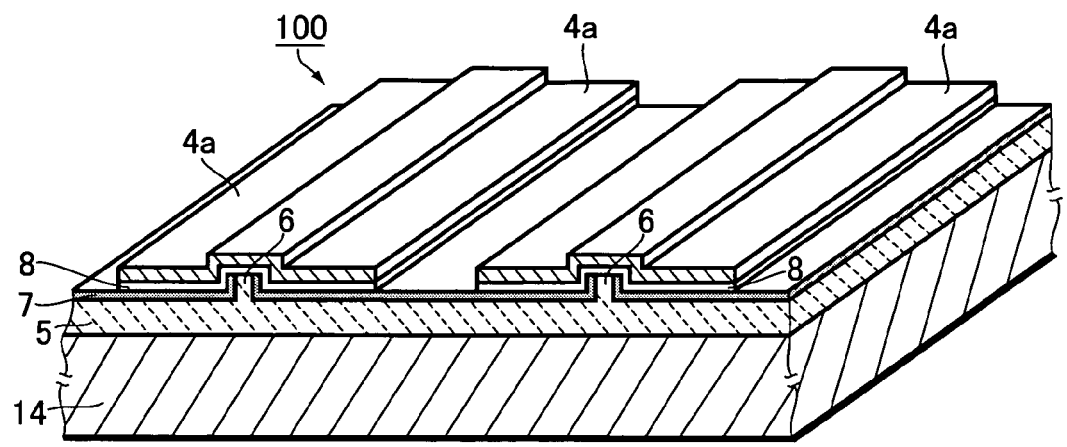
FIGS. 15A and 15B are perspective views for explaining the steps for manufacturing the semiconductor laser device shown in FIGS. 14A and 14B.
Figure 15:
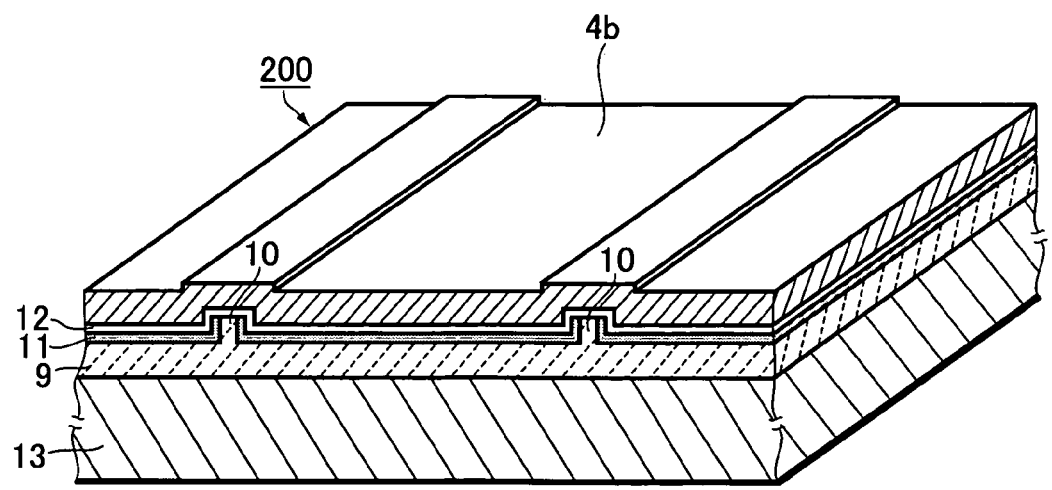
Figure 16:
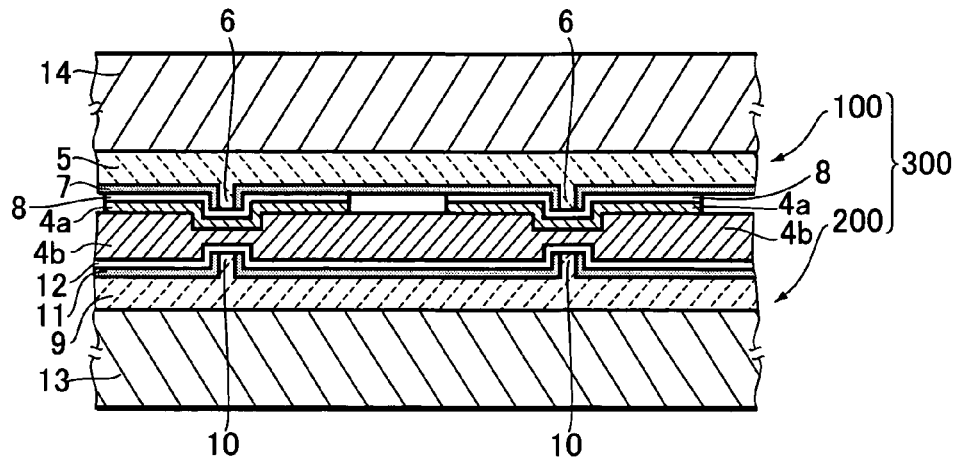
FIGS. 16A to 16C are sectional views for explaining the manufacturing steps subsequent to FIG. 15B.
Figure 16:
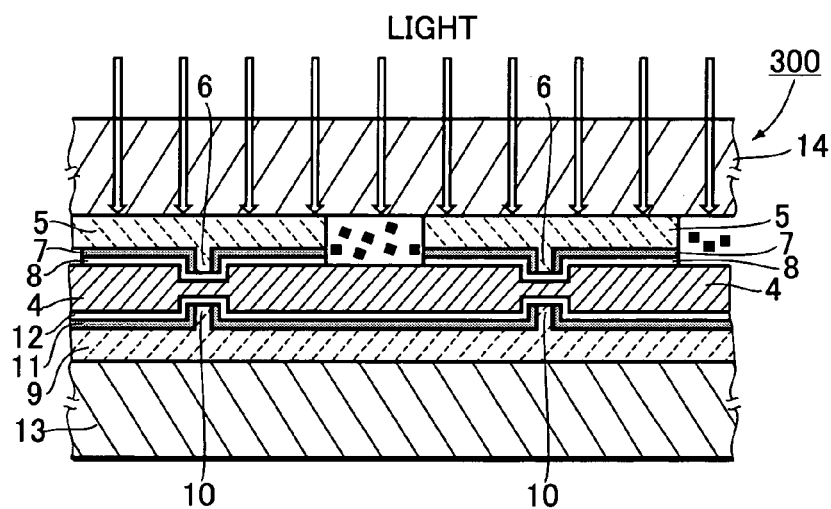
Figure 16:
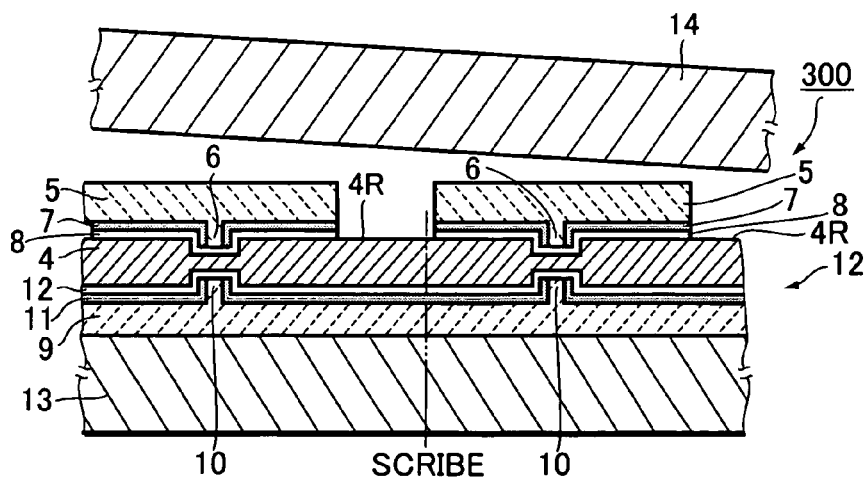

In the case of providing the third light-emitting element 700 for the semiconductor laser device 1 having the structure shown in FIG. 10 or the semiconductor laser device 1 having the structure shown in FIG. 14, the manufacturing method of the present embodiment makes it possible to form the laser part 9 of the second light-emitting element 3 and the laser part 701 of the third light-emitting element 700 as a monolithic semiconductor device (intermediate 200) so that the laser part 5 of the first light-emitting element 2 formed on the intermediate 100 can be transferred to the laser part 9 via the adhesive metal layer 4.

Consequently, the distance between the light-emitting spots can be reduced even when the semiconductor laser device 1 having the structure shown in FIG. 10 or the semiconductor laser device 1 having the structure shown in FIG. 14 is provided with the third light-emitting element 700.

The present embodiment has so far dealt with the case where the laser part 5 of the first light-emitting element 2 is transferred to the laser part 9 of the second light-emitting element 3 via the adhesive metal layer 4. Nevertheless, the structure that the laser part 5 of the first light-emitting element 2 is transferred to the laser part 701 of the third light-emitting element 700 via the adhesive metal layer 4 is also applicable.

In the foregoing embodiments, an anti-difadhesive film of Pt, TiN, Ir, or the like is desirably formed between the adhesive metal layer 4a and the ohmic electrode layer 7 which are formed on the first laser part 5. The aim of this anti-difadhesive film is to prevent Sn, In, or the like in the adhesive metal layer 4, which is made of Au—Sn, Pd—In, or the like, from diffusing through the ohmic electrode 7 to reach the interface to the laser part 5 with the result of an increase in the contact resistance between the laser part 5 and the ohmic electrode 7.

In the foregoing embodiments, an anti-difadhesive film of Pt, TiN, Ir, or the like is also desirably formed between the ohmic electrode layer 12 and the adhesive metal layer 4b which are formed on the second laser part 9.

In the foregoing embodiments, the adhesive metal layer 4a of Au or the like is formed on the laser part 5, and the adhesive metal layer 4b of Sn or the like on the laser part 9b, before these adhesive metal layers 4a and 4b are alloyed with each other. Nevertheless, the adhesive metal layer 4a of Sn or the like may be formed on the laser part 5, and the adhesive metal layer 4b of Au or the like on the laser part 9, before these adhesive metal layers 4a and 4b are alloyed with each other.

The adhesive metal layers 4a and 4b described above may also be made of a combination of Au and In or a combination of Pd and In, aside from the combination of Au and Sn. These combinations, when fused to create the adhesive metal layer 4 of the intermetallic compounds, allow efficient dissipation of heat which occurs during laser emission, without hindering current injection when the drive currents are injected to the respective laser parts.

The ohmic electrode layers and ohmic electrodes described above are not limited to the respective materials listed. Any material may be used as long as it provides an ohmic contact with the respective semiconductor surfaces.

In the foregoing description of the embodiments and examples, the adhesive metal layers 4a and 4b are used as adhesive layers, and are fused to bond the intermediates. Nevertheless, these adhesive layers may be bonded by using solid phase difadhesive at temperatures below the melting point.

While there has been described what are at present considered to be preferred embodiments of the present invention, it will be understood that various modifications may be made thereto, and it is intended that the appended claims cover all such modifications as fall within the true spirit and scope of the invention.

What is claimed is:

1. A method of manufacturing a semiconductor laser device having a first laser part and a second laser part for emitting laser beams of different wavelengths, the method comprising:
   a first step of stacking thin films of group-III nitride compound semiconductors containing at least one selected from the group consisting of aluminum (Al), gallium (Ga), and indium (In), and nitrogen (N) on a sapphire substrate, having a plurality of waveguides for a plurality of said first laser parts, and forming a first adhesive layer thereon to fabricate a first intermediate body;
   a second step of stacking thin films of group III–V compound semiconductors containing at least one selected from the group consisting of aluminum (Al), gallium (Ga), and indium (In), and at least one of arsenic (As), phosphorus (P), and antimony (Sb) on a GaAs substrate to form a plurality of second laser parts protruding from the surface of said GaAs substrate, said second laser parts each having a multilayer structure of said thin films and having a waveguide, and forming a second adhesive layer all over said protruding second laser parts and said GaAs substrate where said second laser part is not formed, thereby forming a second intermediate body;
   a third step of bonding said first adhesive layer and said second adhesive layer lying on said second laser parts so that said waveguides of said first laser part lie adjacent to said waveguides of said second laser parts, thereby fabricating a third intermediate body having a plurality of pairs comprising said first laser part and said second laser part bonded to each other through the interposition of an adhesive layer;
   a fourth step of irradiating a junction between said sapphire substrate and said first laser part with light to be transmitted through said sapphire substrate and absorbed by the group-III nitride compound semiconductors, so that said first laser part in the vicinity of the junction is decomposed, and portions of said first laser part corresponding to regions where said first and second adhesive layers are not in contact are broken;
   a fifth step of removing said sapphire substrate from said third intermediate body to expose said first laser part and said second adhesive layer lying on said GaAs substrate; and
   a sixth step of cleaving said third intermediate body after the removal of said sapphire substrate, and dividing the resultant where said second adhesive layer is exposed, thereby fabricating semiconductor laser devices each including a first laser part and a second laser part a seventh step of bonding an exposed surface of said first laser part and an exposed surface of said adhesive layer onto a support substrate, the seventh step following the sixth step.

2. A method of manufacturing a semiconductor laser device having a first laser part and a second laser part for emitting laser beams of different wavelengths, the method comprising:
   a first step of stacking thin films of group-III nitride compound semiconductors containing at least one selected from the group consisting of aluminum (Al), gallium (Ga), and indium (In), and nitrogen (N) on a sapphire substrate, having a plurality of waveguides for a plurality of said first laser parts, and forming a first adhesive layer thereon, being patterned into stripe arrays along said waveguides to fabricate a first intermediate body, said first adhesive layer covering said waveguides;
   a second step of stacking thin films of group III–V compound semiconductors containing at least one selected from the group consisting of aluminum (Al), gallium (Ga), and indium (In), and at least one selected from the group consisting of arsenic (As), phosphorus (P), and antimony (Sb) on a GaAs substrate, having a plurality of waveguides for a plurality of said second laser parts, and forming a second adhesive layer thereon to fabricate a second intermediate body;
   a third step of bonding said first adhesive layer and said second adhesive layer so that said waveguides of said first laser part lie adjacent to said waveguides of said second laser part, thereby bonding said first laser part and said second laser part through the interposition of an adhesive layer solidified and fabricating a third intermediate body having a plurality of pairs comprising said first laser part and said second laser part, in which part of said second adhesive layer is not bonded to said first laser part;
   a fourth step of irradiating a junction between said sapphire substrate and said first laser part with light to be transmitted through said sapphire substrate and absorbed by the group-III nitride compound semiconductors, so that said first laser part is decomposed in the vicinity of the junction, and regions of said first laser part where said first adhesive layer is not formed are broken;
   a fifth step of removing said sapphire substrate from said third intermediate body to expose said first laser part and portions of said second adhesive layer corresponding to said broken regions of said first laser part; and
   a sixth step of cleaving said third intermediate body after the removal of said sapphire substrate, and dividing the resultant where said second adhesive layer is exposed, thereby fabricating a plurality of semiconductor laser devices each including a first laser part and a second laser part a seventh step of bonding an exposed surface of said first laser part and an exposed surface of said ohmic electrode layer onto a support substrate, the seventh step following the sixth step.

3. A method of manufacturing a semiconductor laser device having a first laser part and a second laser part for emitting laser beams of different wavelengths, the method comprising:
   a first step of stacking thin films of group-III nitride compound semiconductors containing at least one selected from the group consisting of aluminum (Al), gallium (Ga), and indium (In), and nitrogen (N) on a sapphire substrate, having a plurality of waveguides for a plurality of said first laser parts, and forming a first adhesive layer thereon to fabricate a first intermediate body;
   a second step of stacking thin films of group III–V compound semiconductors containing at least one selected from the group consisting of aluminum (Al), gallium (Ga), and indium (In), and at least one selected from the group consisting of arsenic (As), phosphorus (P), and antimony (Sb) on a GaAs substrate having a plurality of waveguides for a plurality of said second laser parts, and forming an ohmic electrode layer of metal thereon, and forming a second adhesive layer on said ohmic electrode layer being patterned into stripe arrays along said waveguides to fabricate a second intermediate body, said second adhesive layer covering said waveguides;
   a third step of bonding said first adhesive layer and said second adhesive layer to each other, thereby fabricating a third intermediate body having a plurality of pairs comprising said first laser part and said second laser part, in which said first laser part and said second laser part are bonded to each other through the interposition of an adhesive layer;

a fourth step of irradiating a junction between said sapphire substrate and said first laser part with light to be transmitted through said sapphire substrate and absorbed by the group-III nitride compound semiconductors, so that said first laser part is decomposed in the vicinity of the junction, and portions of said first laser part corresponding to regions where said second adhesive layer is not formed are broken;

a fifth step of removing said sapphire substrate from said third intermediate body to expose said first laser part and portions of said ohmic electrode layer corresponding to said broken portions of said first laser part; and a sixth step of cleaving said third intermediate body after the removal of said sapphire substrate, and dividing the resultant where said ohmic electrode layer is exposed, thereby fabricating a plurality of semiconductor laser devices each including a first laser part and a second laser part a seventh step of bonding an exposed surface of said first laser part and an exposed surface of said adhesive layer onto a support substrate, the seventh step following the sixth step.

* * * * *